United States Patent
Huang et al.

(10) Patent No.: US 10,879,288 B2
(45) Date of Patent: Dec. 29, 2020

(54) REFLECTOR FOR BACKSIDE ILLUMINATED (BSI) IMAGE SENSOR

(71) Applicant: Taiwan Semiconductor Manufacturing Co., Ltd., Hsin-Chu (TW)

(72) Inventors: Chih-Hui Huang, Yongkang (TW); Cheng-Hsien Chou, Tainan (TW); Cheng-Yuan Tsai, Chu-Pei (TW); Kuo-Ming Wu, Zhubei (TW); Sheng-Chan Li, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/121,958

(22) Filed: Sep. 5, 2018

(65) Prior Publication Data
US 2020/0075657 A1    Mar. 5, 2020

(51) Int. Cl.
*H01L 27/146* (2006.01)

(52) U.S. Cl.
CPC .... *H01L 27/14629* (2013.01); *H01L 27/1464* (2013.01); *H01L 27/14621* (2013.01); *H01L 27/14627* (2013.01); *H01L 27/14636* (2013.01); *H01L 27/14645* (2013.01); *H01L 27/14685* (2013.01); *H01L 27/14689* (2013.01)

(58) Field of Classification Search
CPC ....... H01L 27/14629; H01L 27/1464
USPC ......................................... 257/436
See application file for complete search history.

(56) References Cited

U.S. PATENT DOCUMENTS

| | | |
|---|---|---|
| 7,615,808 B2 | 11/2009 | Pain et al. |
| 9,761,623 B2 * | 9/2017 | Lee ................. H01L 27/1464 |
| 2009/0200586 A1 | 8/2009 | Mao et al. |
| 2017/0236854 A1 | 8/2017 | Lee et al. |
| 2019/0057994 A1 | 2/2019 | Huang et al. |

OTHER PUBLICATIONS

Notice of Allowance dated Jan. 30, 2020 in connection with U.S. Appl. No. 15/935,341.

* cited by examiner

*Primary Examiner* — Mark V Prenty
(74) *Attorney, Agent, or Firm* — Eschweiler & Potashnik, LLC

(57) ABSTRACT

Various embodiments of the present application are directed towards an image sensor having a reflector. In some embodiments, the image sensor comprises a substrate, an interlayer dielectric (ILD) structure, an etch stop layer, a wire, and the reflector. The substrate comprises a photodetector. The ILD structure is over the substrate, and the etch stop layer is over the ILD structure. The wire is in the etch stop layer. The reflector is directly over the photodetector and is in the etch stop layer. An upper surface of the wire is elevated above an upper surface of the reflector. By forming the reflector directly over the photodetector, the reflector may reflect radiation that passes through the photodetector without being absorbed back to the photodetector. This gives the photodetector a second chance to absorb the radiation and enhances the quantum efficiency (QE) of the photodetector.

20 Claims, 14 Drawing Sheets

REFLECTOR FOR BACKSIDE ILLUMINATED (BSI) IMAGE SENSOR

BACKGROUND

Integrated circuits (ICs) with image sensors are used in a wide range of modern day electronic devices, such as, for example, cameras and cell phones. In recent years, complementary metal-oxide semiconductor (CMOS) image sensors have begun to see widespread use, largely replacing charge-coupled device (CCD) image sensors. Compared to CCD image sensors, CMOS image sensors are favored due to low power consumption, small size, fast data processing, a direct output of data, and low manufacturing cost. Some types of CMOS image sensors include frontside illuminated (FSI) image sensors and backside illuminated (BSI) image sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
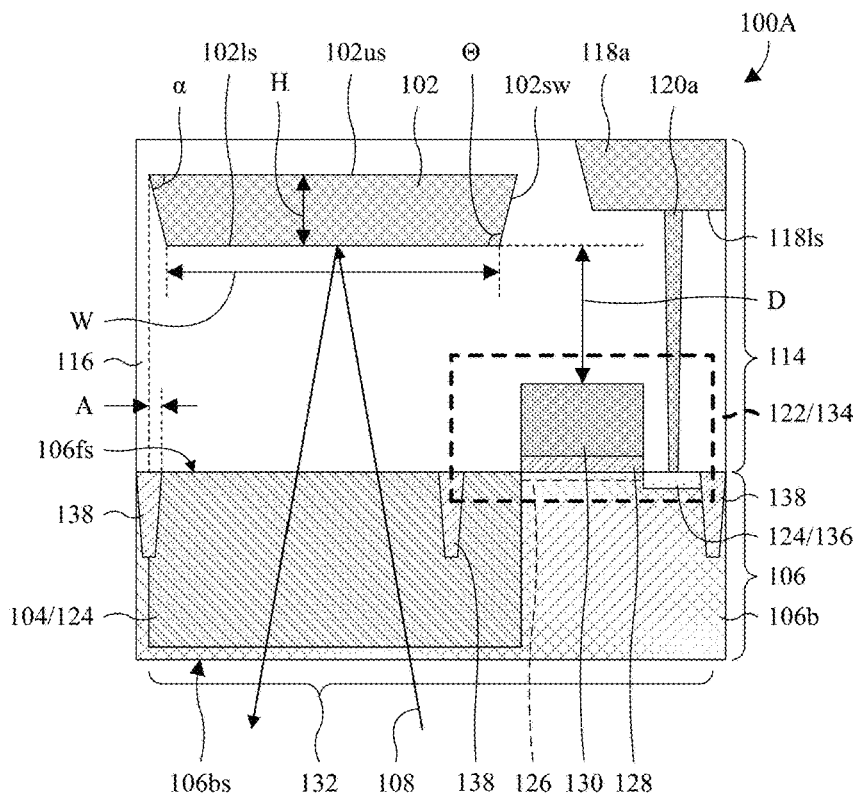
FIGS. 1A-1C illustrate cross-sectional views of various embodiments of a backside illuminated (BSI) image sensor with a reflector.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A complementary metal-oxide semiconductor (CMOS) image sensor (CIS) may comprise a substrate, an array of photodetectors, and an interconnect structure. The substrate defines the array of photodetectors and may, for example, be or comprise monocrystalline silicon, some other silicon, silicon germanium, some other semiconductor material, or any combination of the foregoing. The interconnect structure is on a frontside of the substrate and comprises a dielectric structure, a plurality of wires, and a plurality of vias. The wires and the vias are alternatingly stacked in the dielectric structure. Where the CIS is frontside illuminated (FSI), the array of photodetectors is configured to receive radiation (e.g., photons) from the frontside of the substrate. Where the CIS is backside illuminated (BSI), the array of photodetectors is configured to receive radiation from a backside of the substrate, opposite the frontside of the substrate. By receiving radiation from the backside of the substrate, the radiation is unobstructed by the wires and the vias, whereby the CIS typically has higher quantum efficiency (QE) when BSI.

A challenge with the CIS arises when the substrate is or comprises monocrystalline silicon. Monocrystalline silicon has a large energy bandgap, whereby the substrate and hence the photodetectors have a low absorption coefficient for high wavelength radiation. High wavelength radiation may, for example, include radiation with wavelengths greater than about 900 nanometers, and/or may, for example, include near-infrared (NIR) radiation with a wavelength of about 940 nanometers. Due to the low absorption coefficient, most high wavelength radiation passes through the substrate and the photodetectors without being absorbed. Some high wavelength radiation is reflected back to the array of photodetectors, where it has a second chance of being absorbed. However, much of the high wavelength radiation is not reflected back. Accordingly, the CIS has a low QE for high wavelength radiation and is unsuitable for use with high wavelength radiation.

Various embodiments of the present application are directed towards a BSI image sensor comprising a reflector. In some embodiments, the BSI image sensor comprises a substrate, an interlayer dielectric (ILD) structure, an etch stop layer, a wire, and the reflector. The substrate comprises a photodetector. The ILD structure is over the substrate, and the etch stop layer is over the ILD structure. The wire is in the etch stop layer. The reflector is directly over the photodetector and in the etch stop layer. Further, an upper wire surface of the wire is elevated above an upper reflector surface of the reflector. In some embodiments, the BSI image sensor further comprises a via extending from the wire to the substrate.

By forming the reflector directly over the photodetector, the reflector may reflect radiation that passes through the photodetector without being absorbed back to the photodetector. This gives the photodetector a second chance to absorb the radiation and enhances the QE of the photodetector. The enhanced QE may, for example, enable use of the photodetector with high wavelength radiation. In embodiments in which the via extends from the wire to the substrate, the reflector is in close proximity to the photodetector since the upper wire surface is elevated above the upper reflector surface. As such, radiation is less likely to reflect off the reflector to a neighboring photodetector. Accordingly, cross talk between the photodetector and the neighboring photodetector is low.

With reference to FIG. 1A, a cross-sectional view 100A of some embodiments of a BSI image sensor including a reflector 102 is provided. In some embodiments, the BSI image sensor is or is part of a CIS. Further, in some embodiments, the BSI image sensor is or is part of an integrated circuit (IC) chip. The reflector 102 is directly over a photodetector 104, and the photodetector 104 is in a substrate 106. The photodetector 104 is configured to receive radiation 108 (e.g., photons) from a backside 106bs of the substrate 106, and is further configured to absorb at least a portion of radiation 108. The photodetector 104 may be or comprise, for example, a photodiode or some other photodetector. The substrate 106 may be or comprise, for example, monocrystalline silicon, some other silicon, silicon germanium, some other semiconductor material, or any combination of the foregoing.

The reflector 102 is configured to reflect a portion of the radiation 108 that passes through the photodetector 104 without being absorbed back to the photodetector 104. This gives the photodetector 104 a second chance to absorb the unabsorbed portion of the radiation 108 and enhances the QE of the photodetector 104. The enhanced QE may, for example, enable use of the photodetector 104 with high wavelength radiation. High wavelength radiation may, for example, include radiation with wavelengths greater than about 900 nanometers, and/or may, for example, include NIR radiation with a wavelength of about 940 nanometers. The reflector 102 is or comprises a reflective material, which may be or comprise, for example, aluminum, aluminum copper, copper, tantalum, titanium, tungsten, titanium nitride, some other reflective material, or any combination of the foregoing. In some embodiments, the reflector 102 is conductive. Further, in some of such embodiments, the reflector 102 is electrically floating.

In some embodiments where the photodetector 104 is used with 850 nanometer radiation, the reflector 102 enhances QE of the photodetector 104 to about 42.7%. In some embodiments where the photodetector 104 is used with 940 nanometer radiation, the reflector 102 enhances QE of the photodetector 104 to about 23.8%. In some embodiments in which the reflector 102 is or comprises aluminum copper, the reflector 102 may have a reflectance of about 85% and about 88% respectively for 850 nanometer radiation and 940 nanometer radiation.

A lower reflector surface 102ls of the reflector 102 faces the photodetector 104, and an upper reflector surface 102us of the reflector overlies the lower reflector surface 102ls. In some embodiments, the lower reflector surface 102ls is flat or substantially flat, and/or an upper reflector surface 102us of the reflector 102 is flat or substantially. A reflector surface (e.g., the lower reflector surface 102ls) may, for example, be substantially flat if the vertical separation between a lowest point of the reflector surface and a highest point of the reflector surface is less than about 10, 20, 50, or 100 nanometers. In some embodiments, the lower reflector surface 102ls is curved, whereas the upper reflector surface 102us is flat or substantially flat.

A pair of reflector sidewalls 102sw of the reflector 102 contacts the lower reflector surface 102ls and the upper reflector surface 102us. For ease of illustration, only one of the reflector sidewalls 102sw is labeled 102sw. The reflector sidewalls 102sw are respectively on opposite sides of the reflector 102. In some embodiments, the reflector sidewalls 102sw each contact the lower reflector surface 102ls at an obtuse angle Θ and/or each contact the upper reflector surface 102us at an acute angle α. The obtuse angle Θ may, for example, be about 105 degrees, about 95-115, about 95-105, or about 105-115. The acute angle α may, for example, be about 75 degrees, about 65-85 degrees, about 65-75 degrees, or about 75-85 degrees. In some embodiments, the sum of the acute and obtuse angles Θ, α is about 180 degrees. In some embodiments, the reflector sidewalls 102sw have a planar cross section and/or a planar profile. In other embodiments, the reflector sidewalls 102sw have a curved cross section.

In some embodiments, a cross section of the reflector 102 and/or a profile of the reflector 102 is/are a convex isosceles trapezoid. In some embodiments, the reflector 102 is symmetrical about a vertical axis equally bisecting a reflector width W of the reflector 102, and/or is asymmetrical about a horizontal axis equally bisecting a reflector height H of the reflector 102. In some embodiments, the reflector width W is about 0.3-1.2 micrometers, about 0.3-0.6 micrometers, about 0.6-0.9 micrometers, or about 0.9-1.2 micrometers. In some embodiments, the reflector height H is about 500-2000 angstroms, about 500-1250 angstroms, or about 1250-2000 angstroms.

In some embodiments, reflectance of the reflector 102 varies with the reflector height H. For example, the reflectance may decrease with the reflector height H due to light transmission through the reflector 102. As another example, the reflectance may increase with the reflector height H. In some embodiments in which the reflector 102 is or comprises copper and/or aluminum, the reflector height H is greater than about 500 angstroms, so light transmission through the reflector 102 is minimal and the reflectance is sufficient to enhance QE of the photodetector 104. Further, in some embodiments where the reflector 102 is or comprises copper and/or aluminum, the reflector height H is less than about 2000 angstroms, so material is not wasted on a minimal or null gain in reflectance.

An interconnect structure 114 accommodates the reflector 102 and is on a frontside 106fs of the substrate 106, opposite the backside 106bs of the substrate 106. The interconnect structure 114 comprises an interconnect dielectric structure 116, a wire 118a, and a via 120a. The interconnect dielectric structure 116 may be or comprise, for example, silicon oxide, a low κ dielectric, some other dielectric, or any combination of the foregoing. The low κ dielectric may be or comprise, for example, a dielectric with a dielectric constant κ less than about 3.9, 3, 2, or 1. The wire 118a and the via 120a are in the interconnect dielectric structure 116 and may be or comprise, for example, copper, aluminum copper, aluminum, tungsten, some other metal or conductive material, or any combination of the foregoing. The via 120a extends towards the substrate 106 from the wire 118a and, in some embodiments, contacts the substrate 106. In some embodiments, the wire 118a is elevated relative to the reflector 102. In some embodiments, a lower wire surface 118ls of the wire 118a is vertically spaced from and between the lower and upper reflector surfaces 102ls, 102us. In some embodiments, the lower wire surface 118ls is vertically spaced completely over the upper reflector surface 102us, and/or the lower reflector surface 102*ls* is vertically spaced completely over the substrate 106.

In some embodiments, a semiconductor device 122 borders the photodetector 104, between the interconnect structure 114 and the substrate 106. In some embodiments, the via 120*a* extends from the wire 118*a* to contact with the semiconductor device 122. The semiconductor device 122 may be, for example, a metal-oxide-semiconductor (MOS) device, a MOS field-effect transistor (MOSFET), an insulated-gate field-effector transistor (IGFET), or some other semiconductor device. In some embodiments, the semiconductor device 122 comprises a pair of source/drain regions 124, a selectively-conductive channel 126, a gate dielectric layer 128, and a gate electrode 130.

The source/drain regions 124 are in the substrate 106, respectively at ends of the selectively-conductive channel 126. Further, the source/drain regions 124 directly adjoin a bulk semiconductor region 106*b* of the substrate 106 and have an opposite doping type as the bulk semiconductor region 106*b*. In some embodiments, one of the source/drain regions 124 is defined by the photodetector 104. The selectively-conductive channel 126 is in the bulk semiconductor region 106*b* and extends from one of the source/drain regions 124 to another one of the source/drain regions 124. The gate dielectric layer 128 overlies the selectively-conductive channel 126, and the gate electrode 130 overlies the gate dielectric layer 128. In some embodiments, the gate electrode 130 is spaced below the lower reflector surface 102*ls* by a distance D. The smaller the distance D, the less likely cross talk is between the photodetector 104 and a neighboring photodetector (not shown). The distance D may, for example, be about 800 angstroms, about 700-900 angstroms, about 700-800 angstroms, or about 800-900 angstroms. The gate dielectric layer 128 may be or comprise, for example, silicon oxide and/or some other dielectric material. The gate electrode 130 may be or comprise, for example, doped polysilicon, metal, or some other conductive material.

In some embodiments, the photodetector 104 and the semiconductor device 122 partially define a pixel sensor 132. The pixel sensor 132 may, for example, be an active pixel sensor (APS) or some other pixel sensor. In some embodiments, the semiconductor device 122 corresponds to a transfer transistor 134 of the pixel sensor 132, and/or one of the source/drain regions 124 corresponds to a floating diffusion node (FDN) 136 of the pixel sensor 132. The photodetector 104 is configured to accumulate charge in response to absorbing radiation, and the transfer transistor 134 is configured to transfer the accumulated charge to the FDN 136.

In some embodiments, an isolation structure 138 surrounds the pixel sensor 132. In such embodiments, the isolation structure 138 comprises a pair of isolation segments, and the isolation segments are respectively on opposite sides of the pixel sensor 132. In some embodiments, the isolation structure 138 extends into the photodetector 104 to separate a bulk of the photodetector 104 from the semiconductor device 122. In some embodiments, the reflector 102 overlies the isolation structure 138 by an amount A, which may, for example, be about 0.1-0.3 micrometers, about 0.1-0.2 micrometers, or about 0.2-0.3 micrometers. The isolation structure 138 may be or comprise, for example, a shallow trench isolation (STI) structure, a deep trench isolation (DTI) structure, some other trench isolation structure, or some other isolation structure. Further, in some embodiments, the isolation structure 138 comprise a dielectric material, such as, for example, silicon oxide and/or some other dielectric material.

Figure 1B:
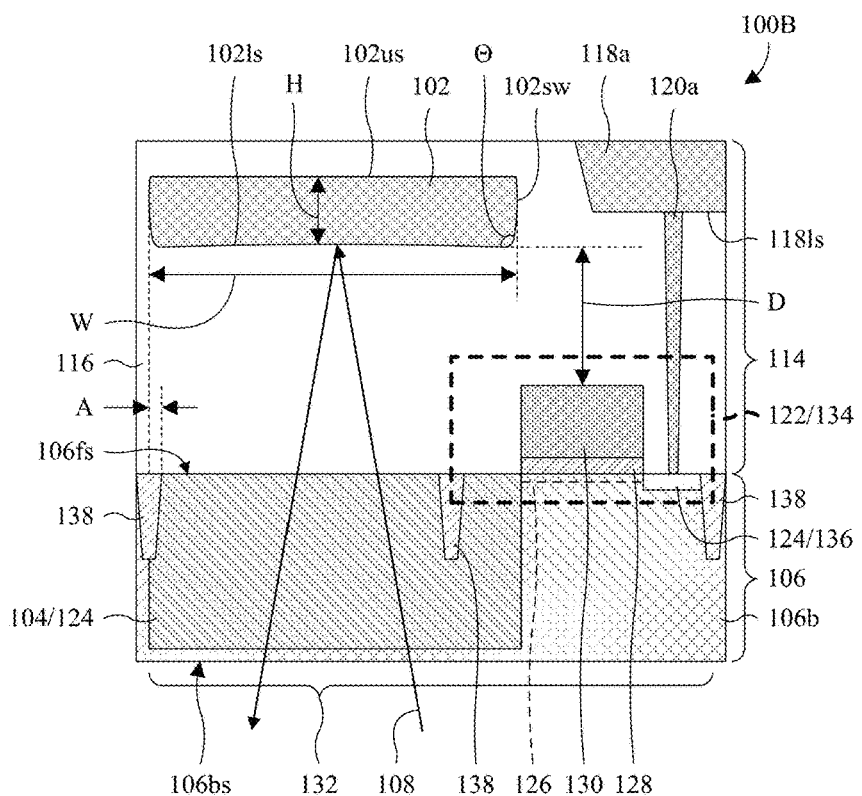

With reference to FIG. 1B, a cross-sectional view 100B of some alternative embodiments of the BSI image sensor of FIG. 1A is provided in which the reflector sidewalls 102*sw* and the lower reflector surface 102*ls* are curved. In some embodiments, even though the lower reflector surface 102*ls* is curved, the extent of the curve is so minimal that the lower reflector surface 102*ls* may be considered substantially flat. As noted above, the lower reflector surface 102*ls* may, for example, be substantially flat if the vertical separation between a lowest point of the lower reflector surface 102*ls* and a highest point of the lower reflector surface 102*ls* is less than about 10, 20, 50, or 100 nanometers.

Figure 1C:
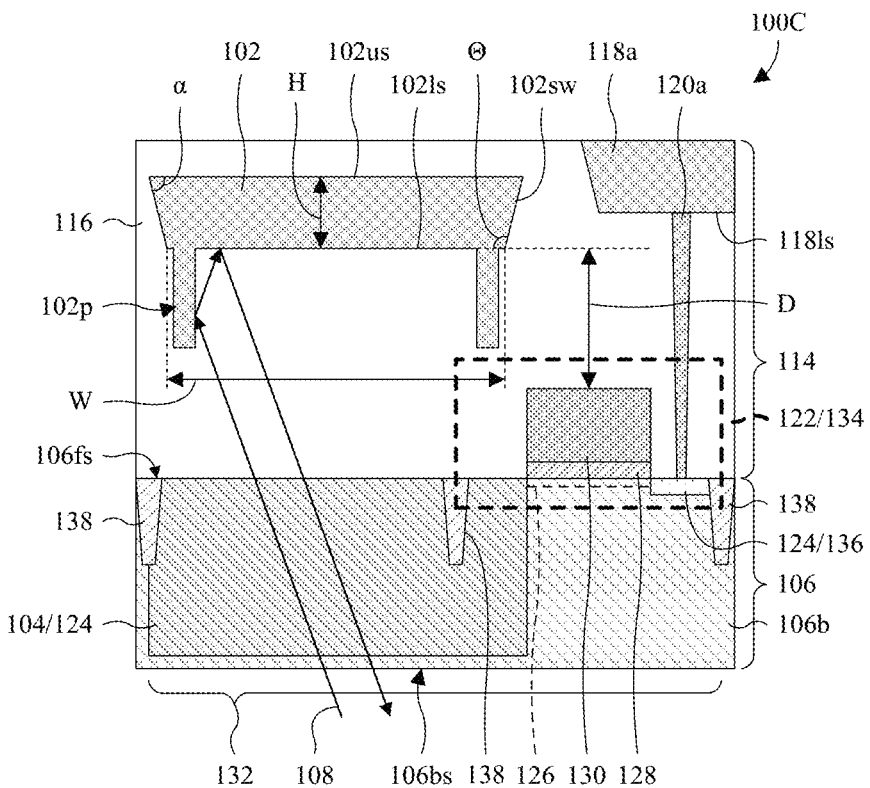

With reference to FIG. 1C, a cross-sectional view 100C of some alternative embodiments of the BSI image sensor of FIG. 1A is provided in which the reflector 102 has a pair of reflector protrusions 102*p*. For ease of illustration, only one of the reflector protrusions 102*p* is labeled 102*p*. The reflector protrusions 102*p* are respectively on opposite sides of the reflector 102 and protrude towards the substrate 106 from the lower reflector surface 102*ls*. The reflector protrusions 102*p* are configured to keep a portion of the radiation 108 that passes through the photodetector 104 without being absorbed localized to the photodetector 104. For example, the reflector protrusions 102*p* may receive unabsorbed radiation that would otherwise miss the lower reflector surface 102*ls* and may reflect the received radiation to the lower reflector surface 102*ls* for reflection back to the photodetector 104. Accordingly, due to the reflector protrusions 102*p* cross talk between the photodetector 104 and a neighboring photodetector (not shown) is reduced. Further, QE of the photodetector 104 is enhanced.

In some embodiments where the photodetector 104 is used with 850 nanometer radiation, the reflector 102 enhances QE of the photodetector 104 to about 47.3%. Note that this is higher than the about 42.7% for the embodiments of FIG. 1A. In some embodiment, where the photodetector 104 is used with 940 nanometer radiation, the reflector 102 enhances QE of the photodetector 104 to about 25.8%. Note that this is higher than the about 23.8% for the embodiments of FIG. 1A. In some embodiments in which the reflector 102 is or comprises aluminum copper, the reflector 102 may have a reflectance of about 87% and about 90% respectively for 850 nanometer radiation and 940 nanometer radiation. Note that these reflectance values are about 2% higher than in the embodiments of FIG. 1A.

Figure 2A:
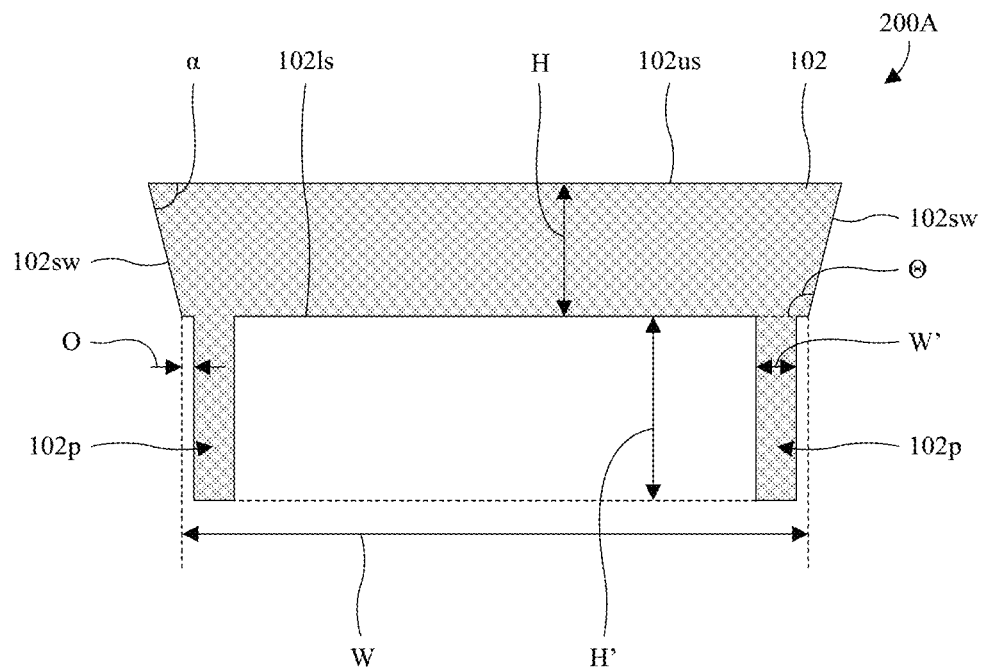
FIGS. 2A and 2B illustrate various views of some embodiments of the reflector of FIG. 1C.

With reference to FIG. 2A, an enlarged cross-sectional view 200A of some embodiments of the reflector 102 of FIG. 1C is provided. A height H' of the reflector protrusions 102*p* may, for example, be about 500-1000 angstroms, about 500-750 angstroms, or about 750-1000 angstroms. A width W' of the reflector protrusions 102*p* may, for example, be about 50-200 nanometers, about 50-125 nanometers, or about 125-200 nanometers. In some embodiments, the reflector protrusions 102*p* have an offset O respectively from the reflector sidewalls 102*sw*. The offset O may, for example, be about 10-50 nanometers, about 50-100 nanometers, or about 10-100 nanometers.

Figure 2B:
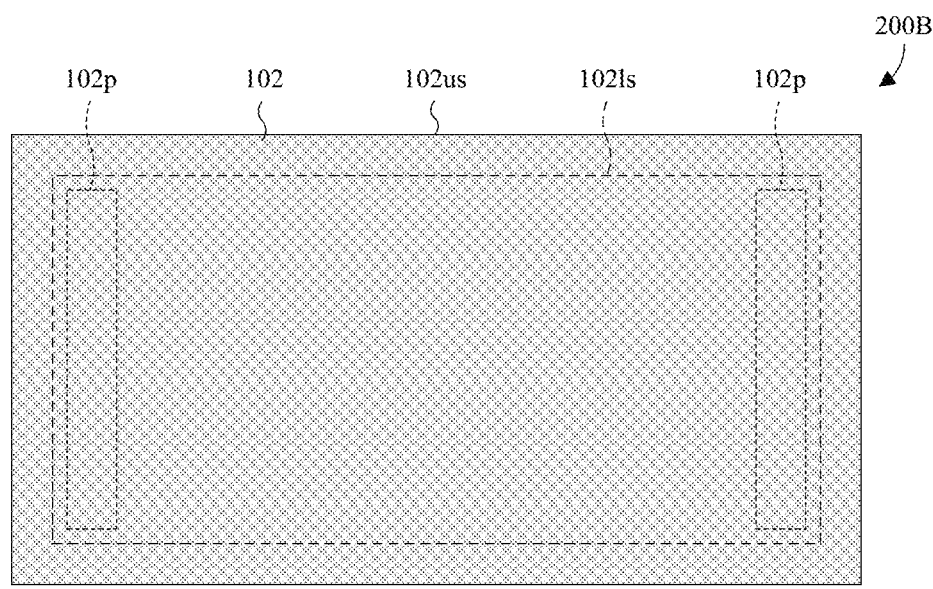

With reference to FIG. 2B, a top view 200B of some embodiments of the reflector 102 of FIG. 1C is provided. The upper reflector surface 102*us* completely covers the lower reflector surface 102*ls* (shown in phantom) and the reflector protrusions 102*p* (shown in phantom). In some embodiments, the upper reflector surface 102*us* and/or the lower reflector surface 102*ls* has/have a rectangular layout. However, the upper and lower reflector surfaces 102*us*, 102*ls* may have other layouts in other embodiments. In some embodiments, the reflector protrusions 102*p* have line-shaped and/or rectangular layouts that are elongated in parallel. However, the reflector protrusions 102p may have other layouts in other embodiments.

Figure 3A:
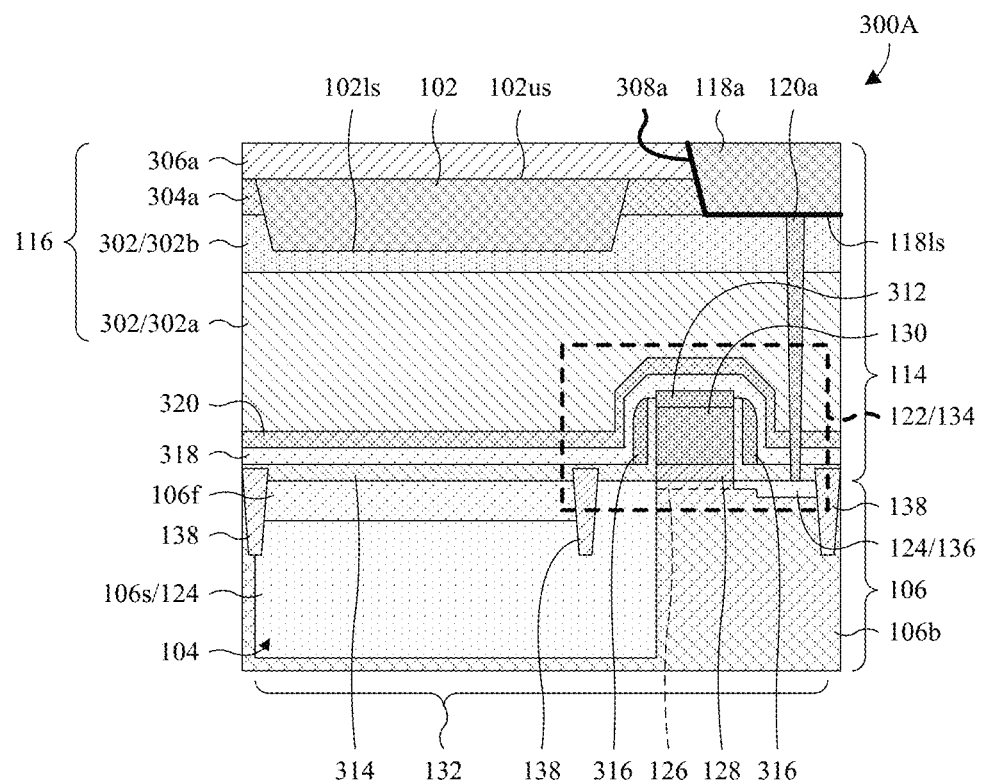
FIGS. 3A-3C illustrate cross-sectional views of various more detailed embodiments respectively of the BSI image sensors of FIGS. 1A-1C.

With reference to FIG. 3A, a cross-sectional view 300A of some more detailed embodiments of the BSI image sensor of FIG. 1A is provided. The interconnect dielectric structure 116 comprises an ILD structure 302, a wire etch stop layer (ESL) 304a, and an interwire dielectric (IWD) layer 306a.

The ILD structure 302 overlies the photodetector 104 and the semiconductor device 122 and may be or comprise, for example, borophosphosilicate glass (BPSG), undoped silicate glass (USG), some other low κ dielectric, silicon oxide, some other dielectric, or any combination of the foregoing. In some embodiments, the ILD structure 302 comprises a first ILD layer 302a and a second ILD layer 302b. The second ILD layer 302b overlies the first ILD layer 302a and is a different material than the first ILD layer 302a. In some embodiments, the first ILD layer 302a is or comprises BPSG, whereas the second ILD layer 302b is or comprises USG. The wire ESL 304a overlies the ILD structure 302, and the IWD layer 306a overlies the wire ESL 304a. Further, the wire ESL 304a and the IWD layer 306a are different materials. The wire ESL 304a may be or comprise, for example, silicon carbide, silicon nitride, silicon oxynitride, some other dielectric material, or any combination of the foregoing. The IWD layer 306a may be or comprise, for example, carbon-doped hydrogenated silicon oxide (e.g., SiCOH), some other low κ dielectric, some other dielectric, or any combination of the foregoing.

The reflector 102 extends through the wire ESL 304a to the ILD structure 302, and the upper reflector surface 102us of the reflector 102 is flush with an upper surface of the wire ESL 304a. Further, the lower reflector surface 102ls of the reflector 102 is recessed into the ILD structure 302. The wire 118a extends through the IWD layer 306a and the wire ESL 304a to the ILD structure 302, and the lower wire surface 118ls of the wire 118a is even or about even with a lower surface of the wire ESL 304a. In some embodiments, an underside of the wire 118a is lined by a barrier layer 308a configured to block material of the wire 118a from diffusing away from the wire 118a. The barrier layer 308a may be or comprise, for example, titanium nitride, tantalum nitride, or some other barrier material for the wire 118a. The via 120a extends through the ILD structure 302 to the semiconductor device 122 from the lower wire surface 118ls.

The photodetector 104 directly underlies the reflector 102. In some embodiments, the photodetector 104 is defined by a first photodetector region 106f of the substrate 106 and a second photodetector region 106s of the substrate 106. The first photodetector region 106f overlies the second photodetector region 106s and extends along a top of the substrate 106. In some embodiments, the first photodetector region 106f extends from a first segment of the isolation structure 138 to a second segment of the isolation structure 138. The second photodetector region 106s adjoins the first photodetector region 106f and has an opposite doping type as the first photodetector region 106f, whereby the first and second photodetector regions 106f, 106s define a PN junction. In some embodiments, the second photodetector region 106s adjoins the bulk semiconductor region 106b and/or has an opposite doping type as the bulk semiconductor region 106b. In some embodiments, the second photodetector region 106s defines one of the source/drain regions 124 of the semiconductor device 122.

In some embodiments, a hard mask 312 overlies the gate electrode 130. The hard mask may be or comprise, for example, silicon oxide, silicon nitride, silicon oxynitride, some other dielectric, or any combination of the foregoing. In some embodiments, a dielectric layer 314 covers the photodetector 104 and/or lines sidewalls of the gate electrode 130. The dielectric layer 314 may be or comprise, for example, tetraethyl orthosilicate (TEOS), TEOS oxide, or some other dielectric layer. In some embodiments, sidewall spacers 316 line sidewalls of the gate electrode 130. In some embodiments in which the dielectric layer 314 is present, the sidewall spacers 316 also overlie the dielectric layer 314. The sidewall spacers 316 may be or comprise, for example, silicon oxide, silicon nitride, silicon oxynitride, some other dielectric, or any combination of the foregoing. In some embodiments, a resist protect layer 318 and/or a contact ESL 320 cover the photodetector 104 and the semiconductor device 122. The resist protect layer 318 may be or comprise, for example, a resist protective oxide (RPO), some other oxide, some other dielectric material, or any combination of the foregoing. The contact ESL 320 may be or comprise, for example, silicon carbide, silicon nitride, silicon oxynitride, some other dielectric material, or any combination of the foregoing.

Figure 3B:
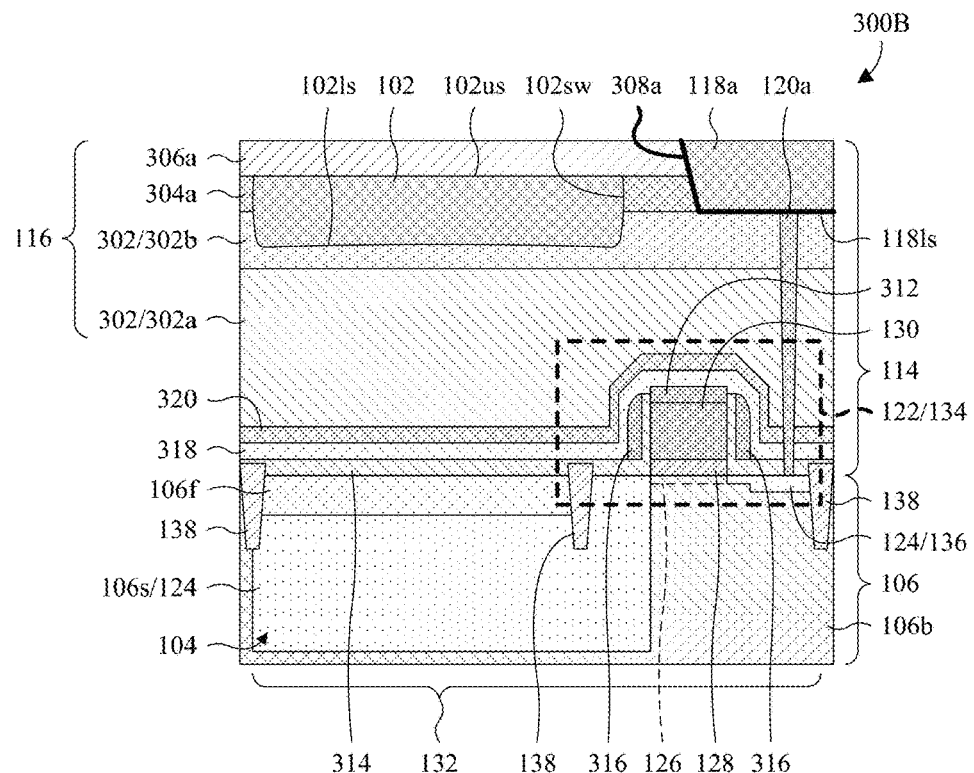

With reference to FIG. 3B, a cross-sectional view 300B of some alternative embodiments of the BSI image sensor of FIG. 3A is provided in which the reflector 102 is as illustrated and described with regard to FIG. 1B. As such, the reflector sidewalls 102sw and the lower reflector surface 102ls are curved. In some embodiments, even though the lower reflector surface 102ls is curved, the extent of the curve is so minimal that the lower reflector surface 102ls may be considered substantially flat.

Figure 3C:
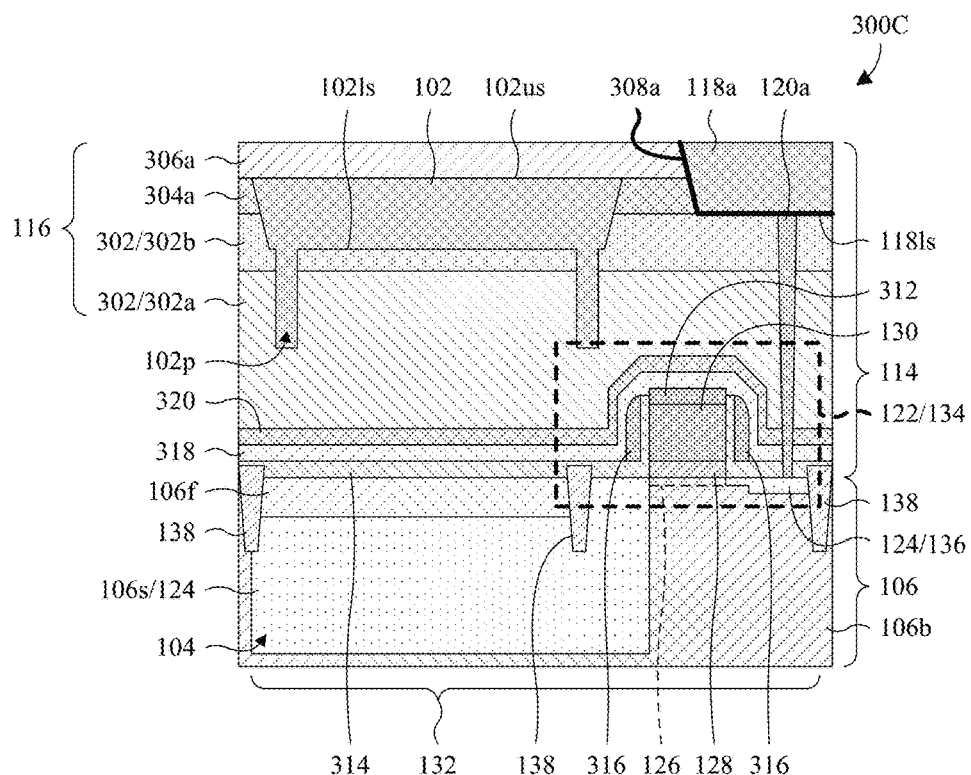

With reference to FIG. 3C, a cross-sectional view 300C of some alternative embodiments of the BSI image sensor of FIG. 3A is provided in which the reflector 102 is as illustrated and described with regard to FIG. 1C. As such, the reflector 102 has a pair of reflector protrusions 102p. For ease of illustration, only one of the reflector protrusions 102p is labeled 102p. The reflector protrusions 102p are respectively on opposite sides of the reflector 102 and protrude towards the substrate 106 from the lower reflector surface 102ls.

Figure 4A:
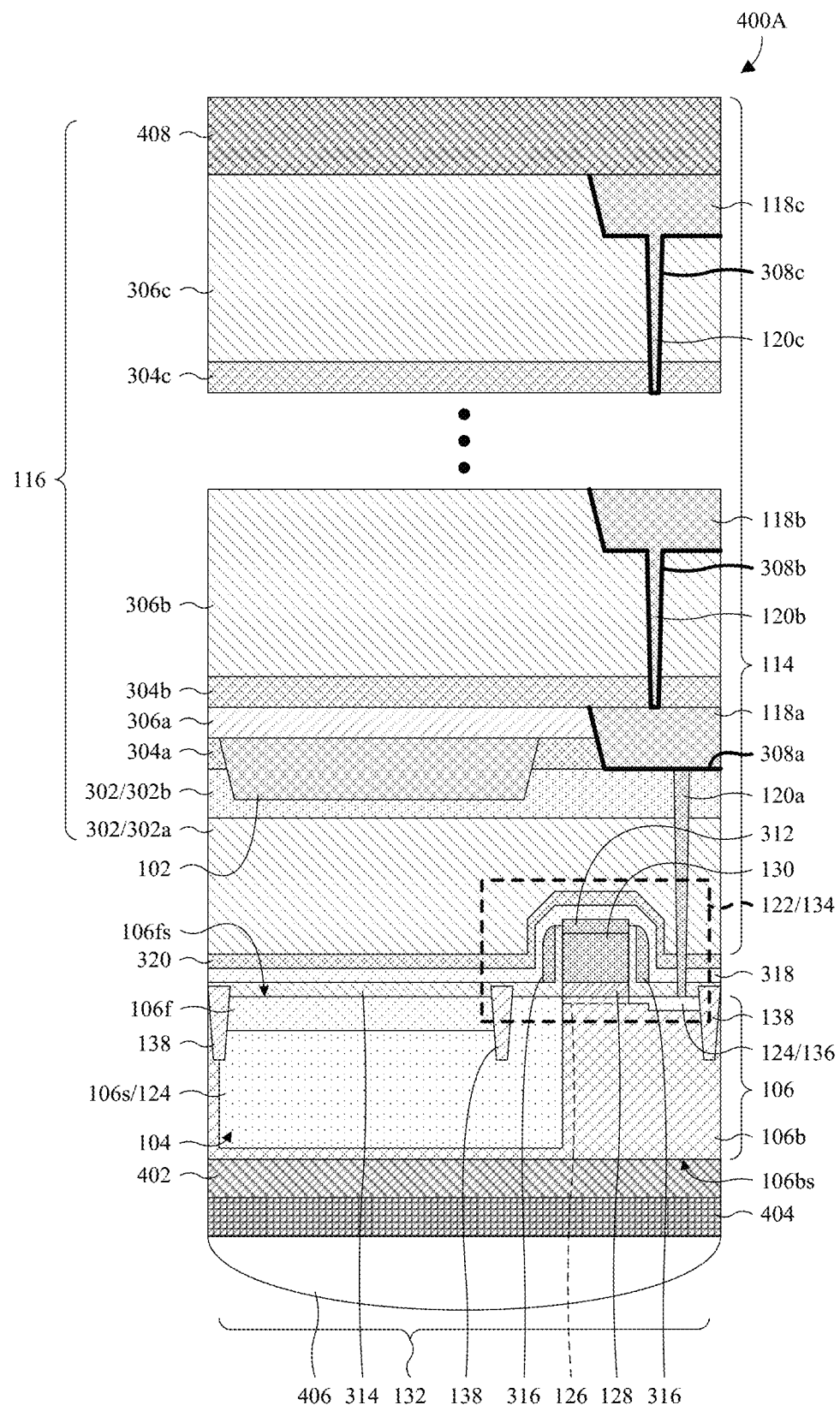
FIGS. 4A and 4B illustrate expanded cross-sectional views of some embodiments respectively of the BSI image sensors of FIGS. 3A and 3C.

With reference to FIG. 4A, an expanded cross-sectional view 400A of some embodiments of the BSI image sensor of FIG. 3A is provided. A backside passivation layer 402, a color filter 404, and a microlens 406 are stacked on the backside 106bs of the substrate 106, such that the color filter 404 is between the microlens 406 and the backside passivation layer 402. The backside passivation layer 402 may be or comprise, for example, silicon oxide, silicon nitride, some other dielectric, or any combination of the foregoing. The color filter 404 is configured to transmit assigned wavelengths of radiation (e.g., red wavelengths) while blocking unassigned wavelengths of radiation (e.g., blue and green wavelengths), and the microlens 406 is configured to focus incident radiation on the photodetector 104.

In some embodiments, the interconnect dielectric structure 116 includes a plurality of additional IWD layers and a plurality of additional wire ESLs. For example, the plurality of additional IWD layers may comprise a second IWD layer 306b and a third IWD layer 306c, and the plurality of additional wire ESLs may comprise a second wire ESL 304b and a third wire ESL 304c. The additional IWD layers and the additional wire ESLs are alternatingly stacked over the IWD layer 306a, such that the additional wire ESLs separate the additional IWD layers from each other and the IWD layer 306a. The plurality of additional IWD layers may be or comprise, for example, carbon-doped hydrogenated silicon oxide (e.g., SiCOH), some other low κ dielectric, silicon oxide, some other dielectric, or any combination of the foregoing. The plurality of additional wire ESLs may be or comprise, for example, silicon carbide, silicon nitride, silicon oxynitride, some other dielectric material, or any combination of the foregoing.

In some embodiments, the interconnect dielectric structure 116 includes a frontside passivation layer 408 over the plurality of additional IWD layers and the plurality of additional wire ESLs. The frontside passivation layer 408 may be or comprise, for example, silicon oxide, silicon nitride, some other dielectric, or any combination of the foregoing.

In some embodiments, a plurality of additional wires and a plurality of additional vias overlie the wire 118a within the additional IWD layers and the additional wire ESLs. For example, the plurality of additional wires may comprise a second wire 118b and a third wire 118c, and the plurality of additional vias may comprise a second via 120b and a third via 120c. The additional wires and the additional vias are alternatingly stacked over the wire 118a. The additional wires and the additional vias may be or comprise, for example, copper, aluminum copper, aluminum, some other conductive material, or any combination of the foregoing.

In some embodiments, a plurality of additional barrier layers line undersides of the additional wires and/or the additional vias. For example, a second barrier layer 308b may line undersides of the second wire 118b and the second via 120b, whereas a third barrier layer 308c may line undersides of the third wire 118c and the third via 120c. The additional barrier layers may be or comprise, for example, titanium nitride, tantalum nitride, or some other barrier material for the additional wires and/or the additional vias.

Figure 4B:
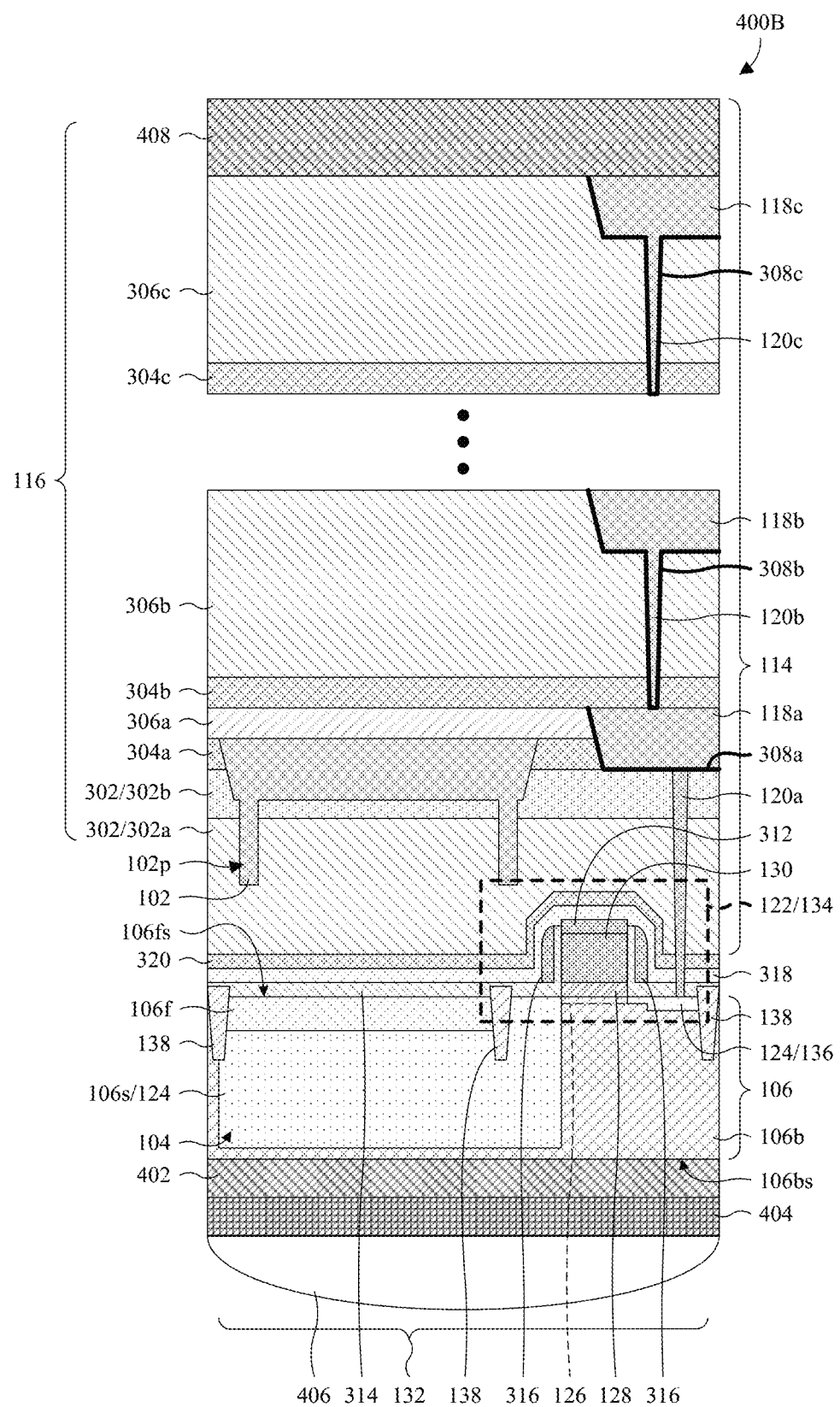

With reference to FIG. 4B, an expanded cross-sectional view 400B of some alternative embodiments of the BSI image sensor of FIG. 4A is provided in which the reflector 102 is as illustrated and described with regard to FIG. 1C.

While FIGS. 4A and 4B are illustrated using embodiments of the reflector 102 in FIGS. 3A and 3C, it is to be appreciated that embodiments of the reflector 102 in FIG. 3B may instead be used within FIG. 4A and/or FIG. 4B in some embodiments. Further, while FIGS. 4A and 4B illustrate three wire levels and three via levels, it is to be appreciated that more or less wire levels and/or more or less via levels are amenable.

Figure 5:
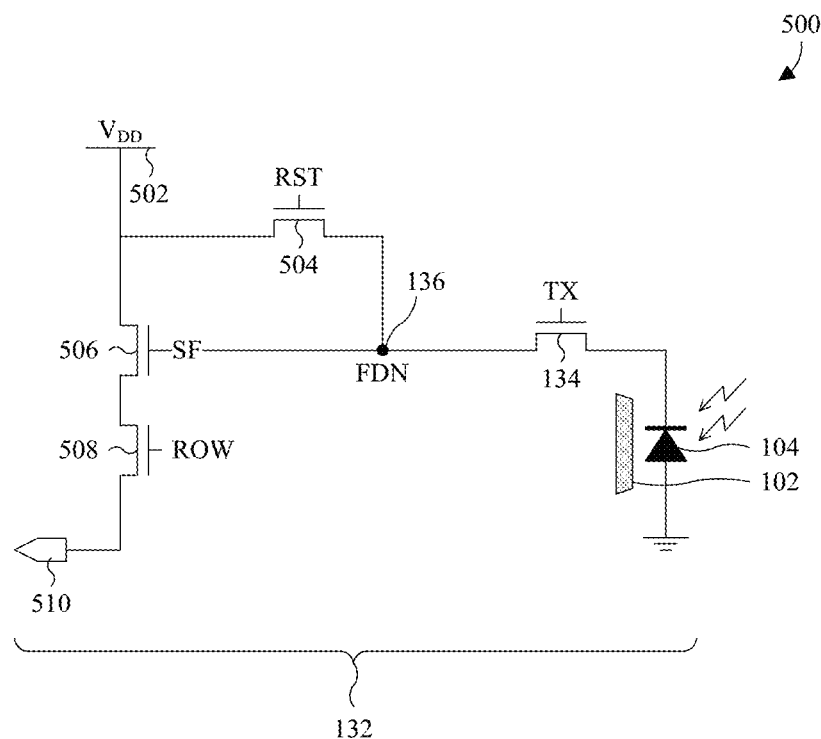
FIG. 5 illustrates a circuit diagram of some embodiments of a pixel sensor in the BSI image sensor of FIG. 1A.

With reference to FIG. 5, a circuit diagram 500 of some embodiments of the pixel sensor 132 in FIG. 1A is provided. The FDN 136 is selectively electrically coupled to the photodetector 104 by the transfer transistor 134 and is selectively electrically coupled to a power source 502 by a reset transistor 504. The power source 502 may be, for example, a direct current (DC) power source. The transfer transistor 134 is configured to transfer charge accumulated in the photodetector 104 to the FDN 136, and the reset transistor 504 is configured to clear the charge. The FDN 136 gates a source follower transistor 506 that selectively electrically couples the power source 502 to a row select transistor 508, and the row select transistor 508 selectively electrically couples the source follower transistor 506 to an output 510. The source follow transistor 506 is configured to non-destructively read and amplify charge stored in the FDN 136, and the row select transistor 508 is configured to select the pixel sensor 132 for readout.

While the pixel sensor 132 is illustrated and described as a five transistor (5T) APS, it is to be appreciated that the pixel sensor 132 may include more or less transistors in other embodiments. For example, other embodiments of the pixel sensor 132 may have two, three, or six transistors.

Further, while the pixel sensor 132 is illustrated with embodiments of the reflector 102 in FIG. 1A, the pixel sensor 132 may include embodiments of the reflector 102 in any one of FIGS. 1B, 1C, 3A-3C, 4A, and 4B in other embodiments.

Figure 6:
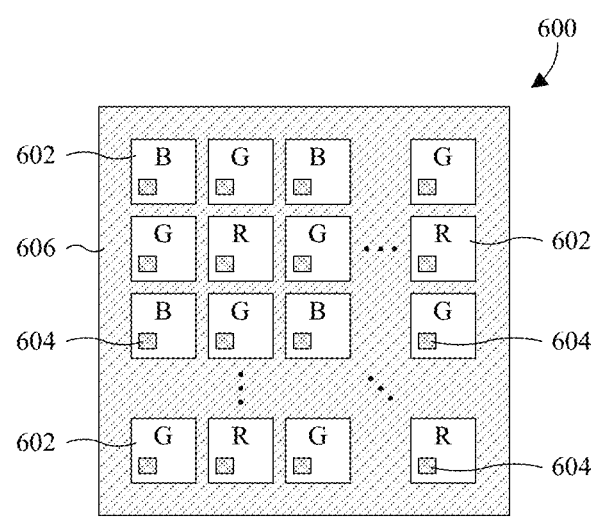
FIG. 6 illustrates a top layout of some embodiments of a BSI image sensor having a plurality of pixel sensors configured as in FIG. 1A.

With reference to FIG. 6, a top layout 600 of some embodiments of a BSI image sensor having a plurality of pixel sensors 602 is provided. For ease of illustration, only some of the pixel sensors 602 are labeled 602. The pixel sensors 602 are arranged in a plurality of rows and a plurality of columns and are assigned respective wavelengths of radiation. In some embodiments, the pixel sensors 602 are alternatingly assigned red, green, and blue wavelengths of radiation. For example, pixel sensors labeled "R" are assigned red wavelengths of radiation, pixel sensors labeled "B" are assigned blue wavelengths of radiation, and pixel sensors labeled "G" are assigned green wavelengths of radiation.

The pixel sensors 602 are each as the pixel sensor 132 is illustrated and described with regard to any one of FIGS. 1A-1C, 3A-3C, 4A, 4B, and 5. The pixel sensors 602 are each associated with a color filter (not shown) configured to filter incident radiation according to the assigned wavelengths of radiation. The color filter 404 in FIGS. 4A and 4B may, for example, be representative of the color filters of the pixel sensors 602. Further, the pixel sensors 602 are each associated with a reflector 604 configured to reflect radiation that passes through a photodetector of the pixel sensor back to the photodetector, thereby enhancing QE of the photodetector. For ease of illustration, the reflector 604 is only labeled for some of the pixel sensors 602. The reflector 604 is as the reflector 102 is illustrated and described with regard to any one of FIGS. 1A-1C, 2A, 2B, 3A-3C, 4A, 4B, and 5.

In some embodiments, the pixel sensors 602 are surrounded by, and separated from each other by, an isolation structure 606. The isolation structure 606 electrically isolates the pixel sensors 602 and may be, for example, an STI structure, a DTI structure, or some other isolation structure. In some embodiments, the isolation structure 606 comprises a dielectric material, such as, for example, silicon oxide or some other dielectric material.

With reference to FIGS. 7-9, 10A-10D, and 11A-11E, a series of cross-sectional views 700-900, 1000A-1000D, 1100A-1100E of various embodiments of a method for forming a BSI image sensor with a reflector 102 is provided. FIGS. 10A-10D illustrate first embodiments of the method in which the BSI image sensor of FIG. 3A is formed, whereas FIGS. 11A-11E illustrate second embodiments of the method in which the BSI image sensor of FIG. 3C is formed. The first embodiments proceed from FIGS. 7-9 to FIGS. 10A-10D, whereas the second embodiments proceed from FIGS. 7-9 to FIGS. 11A-11E. Although the cross-sectional views 700-900, 1000A-1000D, 1100A-1100E shown in FIGS. 7-9, 10A-10D, and 11A-11E are described with reference to a method, it will be appreciated that the structures shown in FIGS. 7-9, 10A-10D, and 11A-11E are not limited to the method but rather may stand alone, separate from the method.

Figure 7:
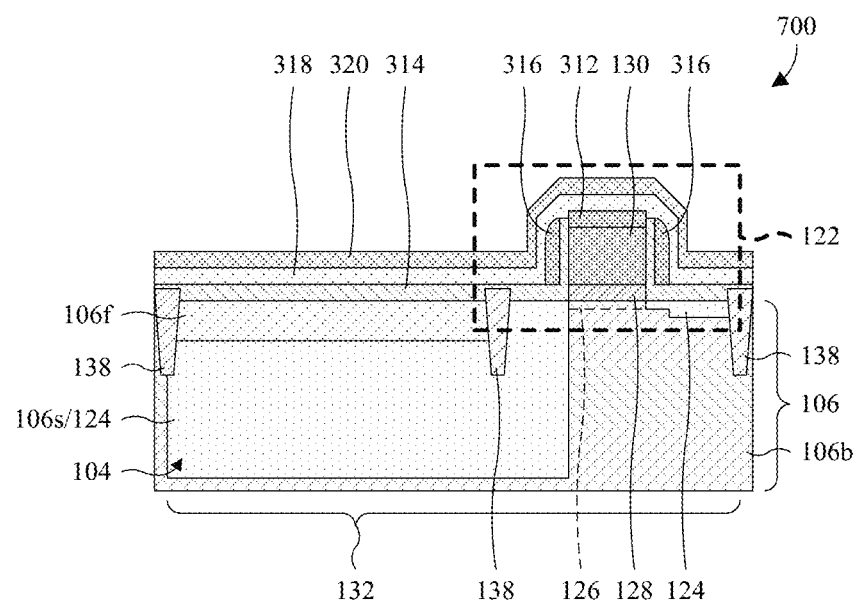
FIGS. 7-9, 10A-10D, and 11A-11E illustrate a series of cross-sectional views of various embodiments of a method for forming a BSI image sensor with a reflector.

As illustrated by the cross-sectional view 700 of FIG. 7, a photodetector 104 is formed in a substrate 106. The photodetector 104 may be, for example, a photodiode or some other photodetector. In some embodiments, the photodetector 104 is defined by a first photodetector region 106f of the substrate 106 and a second photodetector region 106s of the substrate 106. The first photodetector region 106f overlies the second photodetector region 106s, and the second photodetector region 106s overlies and/or borders a bulk semiconductor region 106*b* of the substrate 106. The first photodetector region 106*f* and the bulk semiconductor region 106*b* have a first doping type, and the second photodetector region 106*s* has a second doping type opposite the first doping type. The first and second doping types may, for example, respectively be p-type and n-type, or vice versa. The substrate 106 may be or comprise, for example, monocrystalline silicon and/or some other semiconductor material.

Also illustrated by the cross-sectional view 700 of FIG. 7, a semiconductor device 122 is formed in the substrate 106, adjacent to the photodetector 104. In some embodiments, the semiconductor device 122 comprises a pair of source/drain regions 124, a selectively-conductive channel 126, a gate dielectric layer 128, and a gate electrode 130. The source/drain regions 124 and the selectively-conductive channel 126 are in the substrate 106, and the source/drain regions 124 are respectively at opposite ends of the selectively-conductive channel 126. Further, the source/drain regions 124 have an opposite doping type as the bulk semiconductor region 106*b*. In some embodiments, one of the source/drain regions 124 is defined by the second photodetector region 106*s*. The gate dielectric layer 128 overlies the selectively-conductive channel 126, and the gate electrode 130 overlies the gate dielectric layer 128. The gate dielectric layer 128 may be or comprise, for example, silicon oxide and/or some other dielectric. The gate electrode 130 may be or comprise, for example, doped polysilicon, metal, some other conductive material, or any combination of the foregoing. In some embodiments, the semiconductor device 122 further comprises a hard mask 312 overlying the gate electrode 130. The hard mask 312 may be or comprise, for example, silicon nitride and/or some other dielectric.

In some embodiments, a dielectric layer 314 is formed lining sidewalls of the gate electrode 130 and/or covering the photodetector 104. The dielectric layer 314 may be or comprise, for example, TEOS, TEOS oxide, some other dielectric, or any combination of the foregoing. In some embodiments, sidewall spacers 316 are formed lining sidewalls of the gate electrode 130. In some embodiments, the sidewall spacers 316 are formed overlying the dielectric layer 314 and/or are separated from the sidewalls of the gate electrode 130 by the dielectric layer 314. The sidewall spacers 316 may be or comprise, for example, silicon nitride and/or some other dielectric. In some embodiments, a resist protect layer 318 and/or a contact ESL 320 is/are formed covering the photodetector 104 and the semiconductor device 122. The resist protect layer 318 may, for example, be or comprise RPO and/or some other dielectric. The contact ESL 320 may be or comprise, for example, silicon nitride and/or some other dielectric.

In some embodiments, an isolation structure 138 is formed surrounding a pixel sensor 132 defined in part by the photodetector 104 and the semiconductor device 122. In some embodiments, the isolation structure 138 separates the first photodetector region 106*f* from the semiconductor device 122. In other embodiments, the isolation structure 138 is confined to sides of the pixel sensor 132, whereby it does not separate the first photodetector region 106*f* from the semiconductor device 122. The isolation structure 138 may be or comprise, for example, an STI structure, a DTI structure, some other trench isolation structure, some other isolation structure, or any combination of the foregoing.

Figure 8:
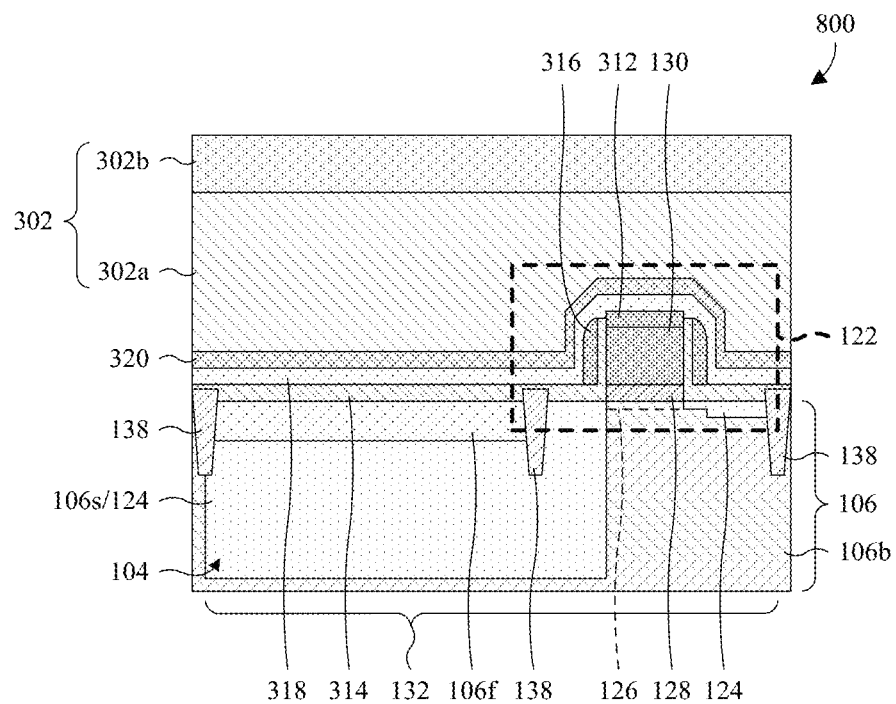

As illustrated by the cross-sectional view 800 of FIG. 8, an ILD structure 302 is formed covering the photodetector 104 and the semiconductor device 122. The ILD structure 302 may be or comprise, for example, BPSG, USG, some other low κ dielectric, silicon oxide, some other dielectric, or any combination of the foregoing. In some embodiments, the ILD structure 302 comprises a first ILD layer 302*a* and a second ILD layer 302*b*. The second ILD layer 302*b* overlies the first ILD layer 302*a* and is a different material than the first ILD layer 302*a*. In some embodiments, the first ILD layer 302*a* is or comprises BPSG, whereas the second ILD layer 302*b* is or comprises USG.

In some embodiments, a process for forming the ILD structure 302 comprises: 1) depositing the first ILD layer 302*a*; 2) performing a planarization into an upper surface of the first ILD layer 302*a*; and 3) depositing the second ILD layer 302*b* over the first ILD layer 302*a*. The depositing of the first and second ILD layers 302*a*, 302*b* may be formed by, for example, chemical vapor deposition (CVD), physical vapor deposition (PVD), thermal oxidation, some other deposition process, or any combination of the foregoing. The planarization of the first ILD layer 302*a* may, for example, be performed by a chemical mechanical polish (CMP) or some other planarization process.

Figure 9:
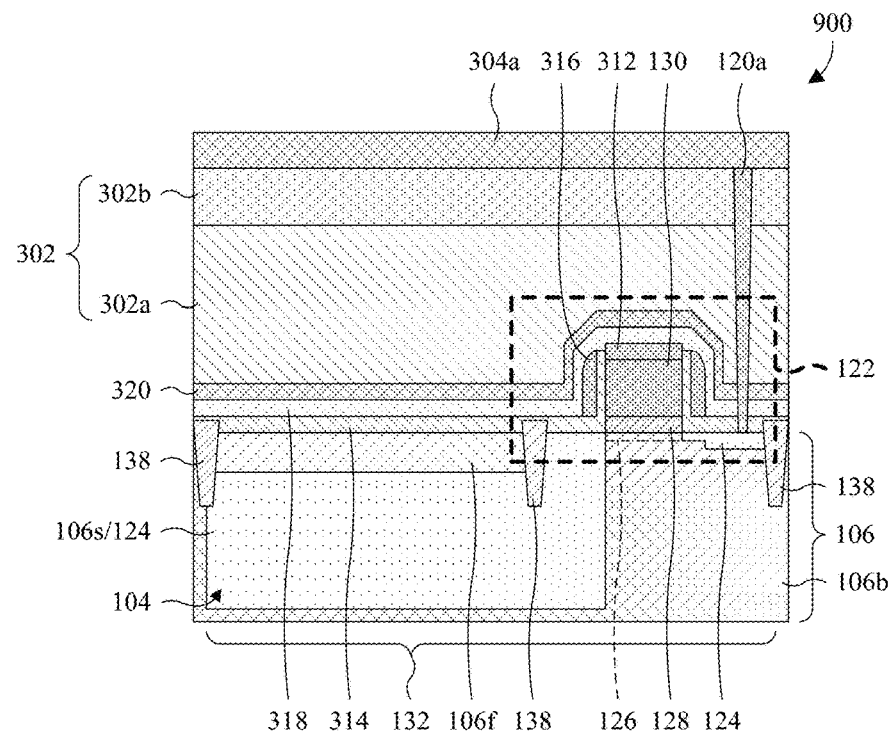

As illustrated by the cross-sectional view 900 of FIG. 9, a via 120*a* is formed extending through the ILD structure 302 to the semiconductor device 122. In some embodiments, the via 120*a* extends to a source/drain region of the semiconductor device 122 on an opposite side of the semiconductor device 122 as the photodetector 104. The via 120*a* may be or comprise, for example, copper, aluminum copper, aluminum, tungsten, some other conductive material, or any combination of the foregoing.

In some embodiments, a process for forming the via 120*a* comprises: 1) patterning the ILD structure 302 to form a via opening; 2) depositing a conductive layer filling the via opening and covering the ILD structure 302; 3) and performing a planarization into the conductive layer until the ILD structure 302 is reached. The patterning may, for example, be performed by a photolithography/etching process or some other patterning process. The contact ESL 320 may, for example, serve as an etch stop for the photolithography/etch process. The depositing may, for example, be performed by CVD, PVD, electroless plating, electroplating, some other deposition process, or any combination of the foregoing. The planarization may, for example, be performed by a CMP or some other planarization process.

Also illustrated by the cross-sectional view 900 of FIG. 9, a wire ESL 304*a* is formed covering the ILD structure 302 and the via 120*a*. The wire ESL 304*a* is dielectric and is a different material than the ILD structure 302. The wire ESL 304*a* may be or comprise, for example, silicon nitride, silicon carbide, some other dielectric, or any combination of the foregoing. The wire ESL 304*a* may, for example, be formed by CVD, PVD, some other deposition process, or any combination of the foregoing.

Figure 10A:
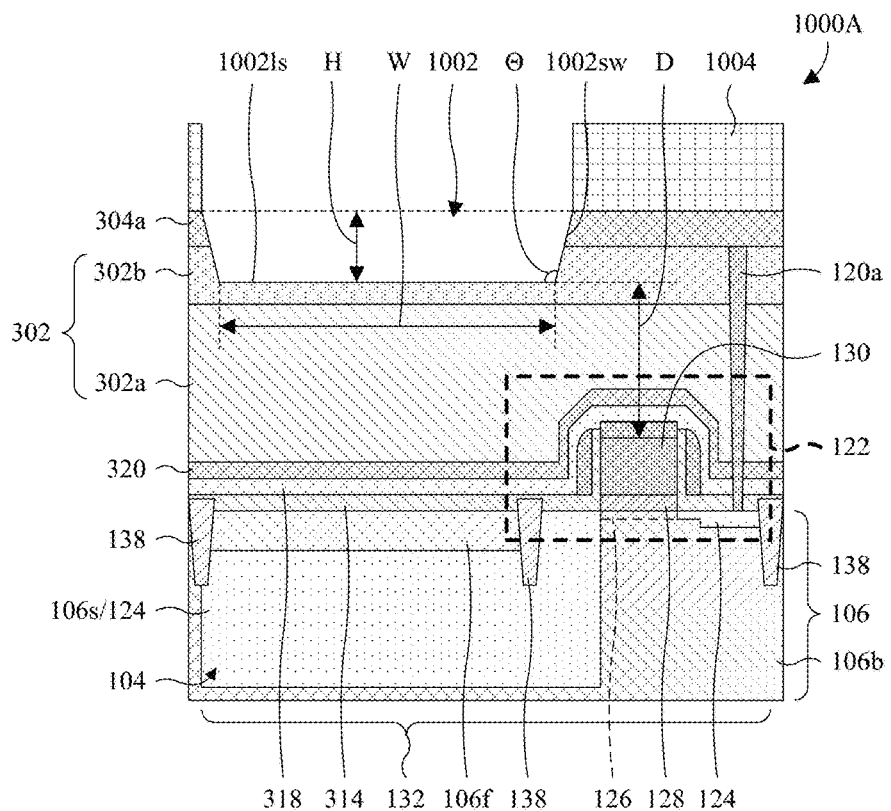

As illustrated by the cross-sectional view 1000A of FIG. 10A, the wire ESL 304*a* and the ILD structure 302 are patterned to form a reflector trench 1002 directly over the photodetector 104. In some embodiments, the reflector trench 1002 is vertically spaced above a top surface of the gate electrode 130 by a distance D. As seen hereafter, a reflector is formed in the reflector trench 1002. The smaller the distance D, the less likely the reflector is to reflect radiation to a neighboring photodetector (not shown). Accordingly, the smaller the distance D, the less likely cross talk is between the photodetector 104 and the neighboring photodetector. The distance D may, for example, be about 800 angstroms, about 700-900 angstroms, about 700-800 angstroms, or about 800-900 angstroms.

The patterning forms a lower trench surface 1002*ls* in the reflector trench 1002. In some embodiments, the lower trench surface 1002*ls* is defined by the ILD structure 302. In other embodiments, the lower trench surface 1002*ls* is defined by the wire ESL 304*a*. In some embodiments, the lower trench surface 1002*ls* is flat or substantially flat. The lower trench surface 1002*ls* may, for example, be substantially flat if the vertical separation between a lowest point of the reflector surface and a highest point of the reflector surface is less than about 10, 20, 50, or 100 nanometers. In other embodiments, the lower trench surface 1002*ls* is curved.

The patterning also forms a pair of trench sidewalls 1002*sw* in the reflector trench 1002. For ease of illustration, only one of the trench sidewalls 1002*sw* is labeled 1002*sw*. The trench sidewalls 1002*sw* are defined by the wire ESL 304*a* and, in some embodiments, the ILD structure 302. The trench sidewalls 1002*sw* contact the lower trench surface 1002*ls* and are respectively on opposite sides of the reflector trench 1002. In some embodiments, the trench sidewalls 1002*sw* each contact the lower trench surface 1002*ls* at an obtuse angle Θ. The obtuse angle Θ may, for example, be about 105 degrees, about 95-115, about 95-105, or about 105-115. In some embodiments, the trench sidewalls 1002*sw* have a planar cross section. In other embodiments, the trench sidewalls 1002*sw* have a curved cross section. As seen hereafter, the reflector trench 1002 is filled with a conductive material to form a reflector in the reflector trench 1002. If the obtuse angle is too shallow (e.g., less than about 95 degrees), voids may form in the conductive material while being deposited in the reflector trench 1002. Further, the voids may negatively affect the reflectance of the reflector.

In some embodiments, a cross section of the reflector trench 1002 is a convex isosceles trapezoid. In some embodiments, the reflector trench 1002 is symmetrical about a vertical axis equally bisecting a trench width W of the reflector trench 1002, and/or is asymmetrical about a horizontal axis equally bisecting a trench height H of the reflector trench 1002. In some embodiments, the trench width W is about 0.3-1.2 micrometers, about 0.3-0.6 micrometers, about 0.6-0.9 micrometers, or about 0.9-1.2 micrometers. In some embodiments, the trench height H is about 500-2000 angstroms, about 500-1250 angstroms, or about 1250-2000 angstroms. As seen hereafter, a reflector hereafter formed takes on the shape of the reflector trench 1002. If the trench height H is too little (e.g., less than about 500 angstroms), the reflector may be too thin and may transmit incident radiation, whereby the reflector may have poor reflectance. Further, if the trench height H is too great (e.g., greater than about 2000 angstroms), material may be wasted for a minimal or null gain in reflectance.

In some embodiments, a process for patterning the wire ESL 304*a* and the ILD structure 302 to form the reflector trench 1002 comprises a photolithography/etching process. In some embodiments, the process comprises: 1) forming a mask 1004 over the wire ESL 304*a* and having a pattern of the reflector trench 1002; 2) performing an etch into the wire ESL 304*a* and the ILD structure 302 with the mask 1004 in place to form the reflector trench 1002; and 3) removing the mask 1004. The mask 1004 may be or comprise, for example, silicon nitride, silicon oxide, some other hard mask material, photoresist, or any combination of the foregoing.

Figure 10B:
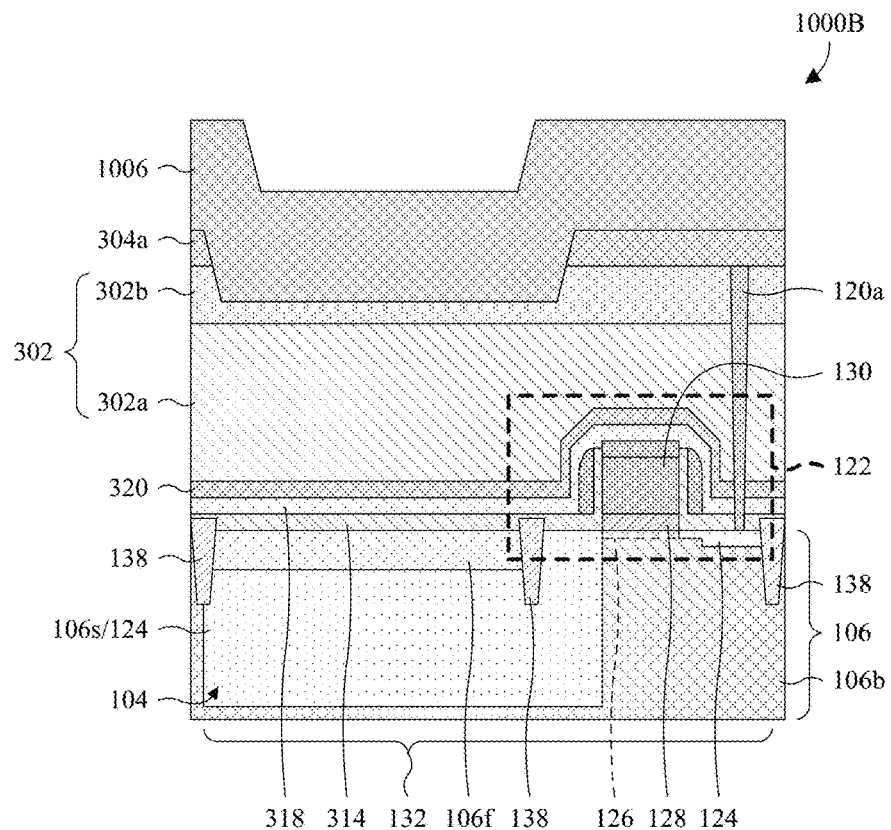

As illustrated by the cross-sectional view 1000B of FIG. 10B, a reflective layer 1006 is formed covering the wire ESL 304*a* and further filling the reflector trench 1002 (see FIG. 10A). The reflective layer 1006 is or comprises a reflective material. In some embodiments, the reflective material is conductive. In other embodiments, the reflector material is dielectric. The reflective material may be or comprise, for example, aluminum, aluminum copper, copper, some other reflective material, or any combination of the foregoing. In some embodiments, the reflective layer 1006 is formed by CVD, PVD, electroless plating, electroplating, some other deposition process, or any combination of the foregoing.

Figure 10C:
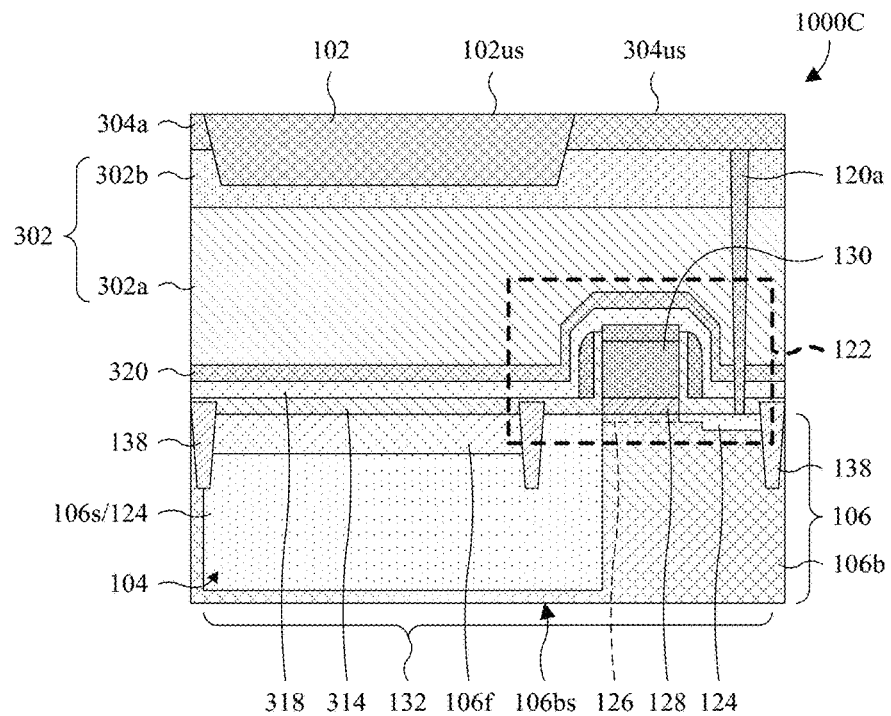

As illustrated by the cross-sectional view 1000C of FIG. 10C, a planarization is performed into the reflective layer 1006 (see FIG. 10B) to form a reflector 102 in the reflector trench 1002 (see FIG. 10A). Due to the planarization, an upper reflector surface 102*us* of the reflector 102 is flush with an upper ESL surface 304*us* of the wire ESL 304*a*. The planarization may, for example, be performed by a CMP or some other planarization process.

During use of the photodetector 104, the photodetector 104 receives radiation (e.g., photons) from a backside 106*bs* of the substrate 106. A portion of the radiation is absorbed by the photodetector 104, whereas a remainder of the radiation passes through the photodetector 104. The reflector 102 reflects a portion of the radiation that passes through the photodetector 104 without being absorbed back to the photodetector 104. This gives the photodetector 104 a second chance to absorb the unabsorbed portion of the radiation and enhances the QE of the photodetector 104. The enhanced QE may, for example, enable use of the photodetector 104 with high wavelength radiation. High wavelength radiation may, for example, include radiation with wavelengths greater than about 900 nanometers, and/or may, for example, include NIR radiation with a wavelength of about 940 nanometers.

Figure 10D:
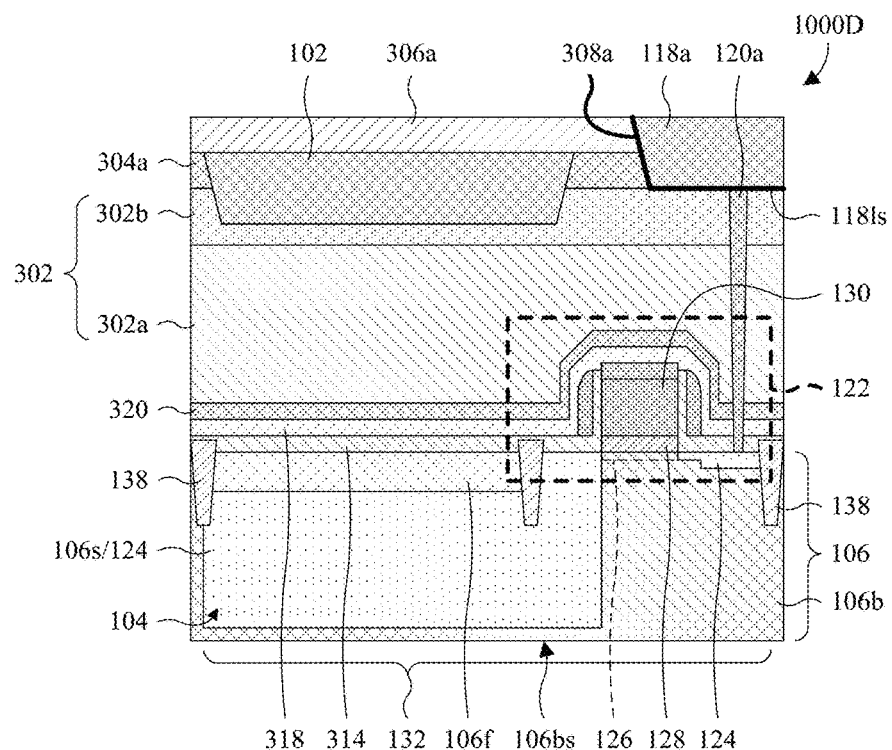

As illustrated by the cross-sectional view 1000D of FIG. 10D, an IWD layer 306*a* is formed covering the reflector 102 and the wire ESL 304*a*. The IWD layer 306*a* is dielectric and is a different material than the wire ESL 304*a*. The IWD layer 306*a* may be or comprise, for example, SiCOH, some other low κ dielectric, some other dielectric, or any combination of the foregoing. The IWD layer 306*a* may, for example, be formed by CVD, PVD, some other deposition process, or any combination of the foregoing.

Also illustrated by the cross-sectional view 1000D of FIG. 10D, a wire 118*a* is formed overlying and contact the via 120. The wire 118*a* extends through the IWD layer 306*a* and the wire ESL 304*a* to the ILD structure 302, and a lower wire surface 118*ls* of the wire 118*a* is even or about even with a lower surface of the wire ESL 304*a*. In some embodiments, the wire 118*a* is elevated relative to the reflector 102. In some embodiments, an underside of the wire 118*a* is lined by a barrier layer 308*a*. The barrier layer 308*a* blocks material of the wire 118*a* from diffusing away from the wire 118*a*. The barrier layer 308*a* may be or comprise, for example, titanium nitride, tantalum nitride, or some other barrier material for the wire 118*a*. The wire 118*a* may be or comprise, for example, copper, aluminum copper, aluminum, some other metal or conductive material, or any combination of the foregoing.

In some embodiments, a process for forming the wire 118*a* comprises: 1) patterning the IWD layer 306*a* and the wire ESL 304*a* to form a wire opening with a layout of the wire 118*a*; 2) depositing the barrier layer 308*a* covering the IWD layer 306*a* and lining the wire opening; 3) depositing a conductive layer filling the wire opening, and further covering the IWD layer 306*a*, over the barrier layer 308*a*; and 4) performing a planarization into the conductive layer and the barrier layer 308*a* until the IWD layer 306*a* is reached to form the wire 118*a* and the localize the barrier layer 308*a* to the wire opening. The patterning may, for example, be performed by a photolithography/etching process or some other patterning process. The wire ESL 304a may, for example, serve as an etch stop while etching through the IWD layer 306a during the photolithography/etch process or some other etching process. The depositing of the barrier layer 308a and the conductive layer may, for example, be performed by CVD, PVD, electroless plating, electroplating, some other deposition process, or any combination of the foregoing. In some embodiments, the barrier layer 308a also serves as a seed layer while depositing the conductive layer. The planarization may, for example, be performed by a CMP or some other planarization process.

As noted above, FIGS. 7-9, 10A-10D, and 11A-11E illustrate various embodiments of a method for forming a BSI image sensor with a reflector. FIGS. 7-9 and 10A-10D illustrate first embodiments of the method in which the BSI image sensor of FIG. 3A is formed. FIGS. 7-9 and 11A-10E illustrate second embodiments of the method in which the BSI image sensor of FIG. 3C is formed. Accordingly, FIGS. 7-9 may, for example, be shared between the first and second embodiments, whereas FIGS. 10A-10D and FIGS. 11A-11E may, for example, be alternatives corresponding to the first and second embodiments.

Figure 11A:
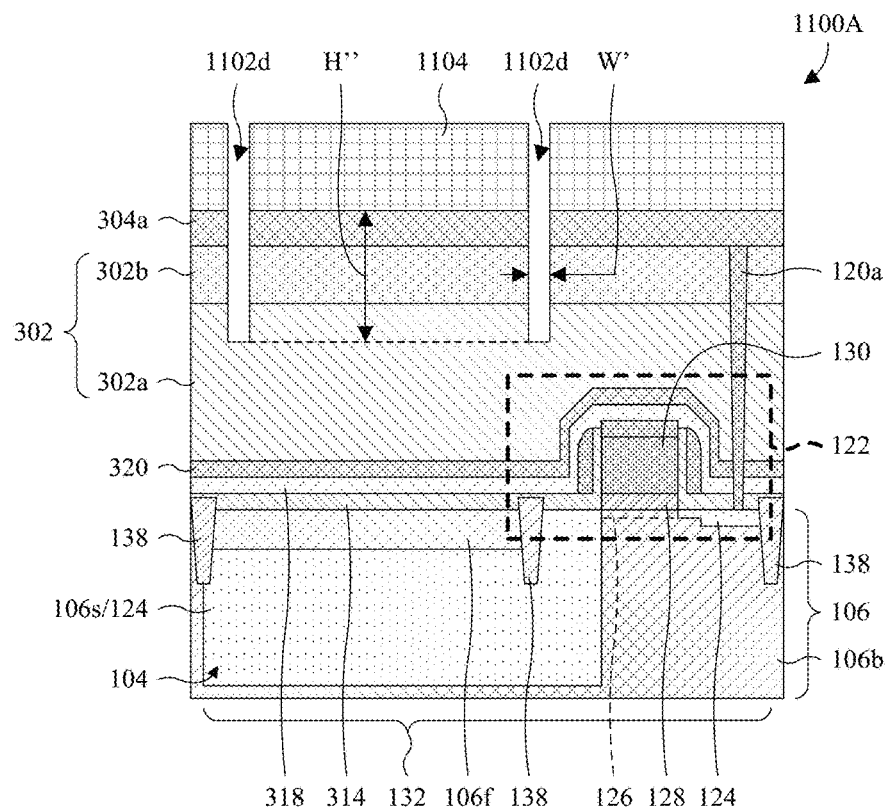

As illustrated by the cross-sectional view 1100A of FIG. 11A, the wire ESL 304a and the ILD structure 302 are patterned to form a pair of deep reflector trenches 1102d. The deep reflector trenches 1102d are respectively on opposite sides of the photodetector 104 and, in some embodiments, one or both of the deep reflector trenches 1102d is/are directly over the photodetector 104. In some embodiments, the deep reflector trenches 1102d are vertically spaced above a top surface of the gate electrode 130 and/or above a top surface of the substrate 106. In some embodiments, the deep reflector trenches 1102d have rectangular cross sections. In some embodiments, widths W' of the deep reflector trenches 1102d may, for example, be about 50-200 nanometers, about 50-125 nanometers, or about 125-200 nanometers. In some embodiments, heights H" of the deep reflector trenches 1102d may, for example, be about 1000-3000 angstroms, about 1000-2000 angstroms, or about 2000-3000 angstroms. In some embodiments, the deep reflector trenches 1102d are completely spaced from each other.

In some embodiments, a process for patterning the wire ESL 304a and the ILD structure 302 to form the deep reflector trenches 1102d comprises a photolithography/etching process. In some embodiments, the process comprises: 1) forming a mask 1104 over the wire ESL 304a and having a pattern of the deep reflector trenches 1102d; 2) performing an etch into the wire ESL 304a and the ILD structure 302 with the mask 1104 in place to form the deep reflector trenches 1102d; and 3) removing the mask 1104. The mask 1104 may be or comprise, for example, silicon nitride, silicon oxide, some other hard mask material, photoresist, or any combination of the foregoing.

Figure 11B:
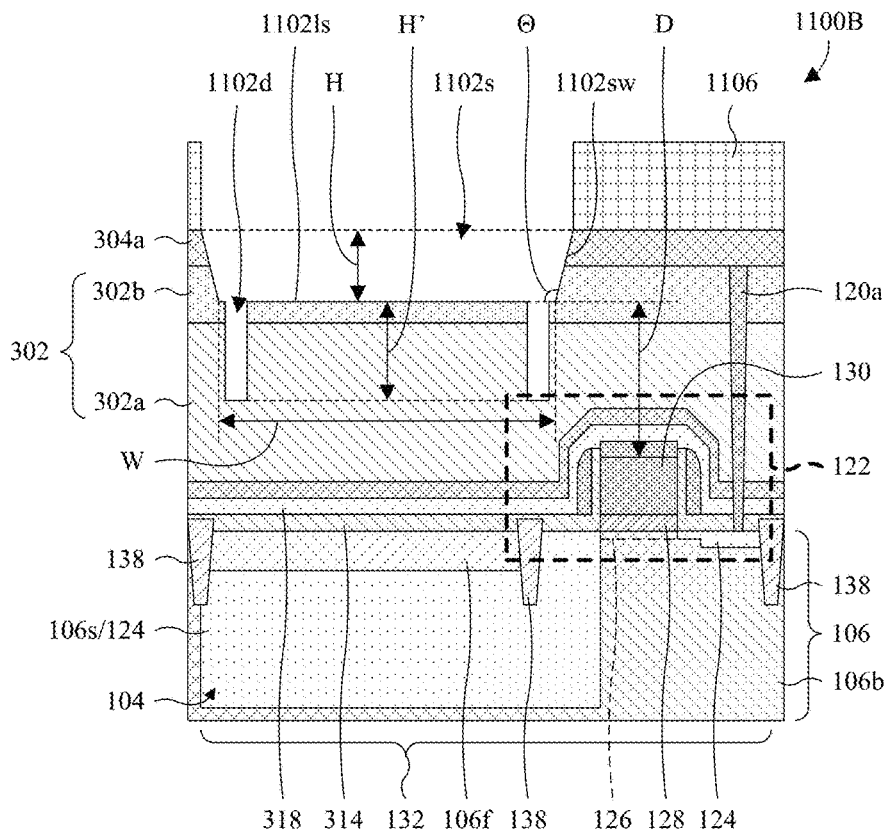

As illustrated by the cross-sectional view 1100B of FIG. 11B, the wire ESL 304a and the ILD structure 302 are further patterned to form a shallow reflector trench 1102s. The shallow reflector trench 1102s is shallow compared to the deep reflector trenches 1102d and overlies the photodetector 104 and the deep reflector trenches 1102d. Further, the shallow reflector trench 1102s extends laterally from one of the deep reflector trenches 1102d to another one of the deep reflector trenches 1102d, such that the deep and shallow reflector trenches 1102d, 1102s collectively define a multilevel reflector trench. In some embodiments, the shallow reflector trench 1102s is vertically spaced above an upper surface of the gate electrode 130 by a distance D. The distance D may, for example, be about 800 angstroms, about 700-900 angstroms, about 700-800 angstroms, or about 800-900 angstroms.

The patterning forms a lower trench surface 1102ls in the shallow reflector trench 1102s. In some embodiments, the lower trench surface 1102ls is defined by the ILD structure 302. In other embodiments, the lower trench surface 1102ls is defined by the wire ESL 304a. In some embodiments, the lower trench surface 1102ls is flat or substantially flat. other embodiments, the lower trench surface 1102ls is curved.

The patterning further forms a pair of trench sidewalls 1102sw in the shallow reflector trench 1102s. For ease of illustration, only one of the trench sidewalls 1102sw is labeled 1102sw. The trench sidewalls 1102sw are defined by the wire ESL 304a and, in some embodiments, the ILD structure 302. The trench sidewalls 1102sw contact the lower trench surface 1102ls and are respectively on opposite sides of the shallow reflector trench 1102s. In some embodiments, the trench sidewalls 1102sw each contact the lower trench surface 1102ls at an obtuse angle $\Theta$. The obtuse angle $\Theta$ may, for example, be about 105 degrees, about 95-115, about 95-105, or about 105-115. In some embodiments, the trench sidewalls 1102sw have planar cross sections or curved cross sections. In some embodiments, the trench sidewalls 1102sw are offset from the deep reflector trenches 1102d.

In some embodiments, the patterning forms the shallow reflector trench 1102s such that a cross section of the shallow reflector trench 1102s is a convex isosceles trapezoid. In some embodiments, the patterning forms the shallow reflector trench 1102s such that it is symmetrical about a vertical axis equally bisecting a trench width W of the shallow reflector trench 1102s. In some embodiments, the trench width W is about 0.3-1.2 micrometers, about 0.3-0.6 micrometers, about 0.6-0.9 micrometers, or about 0.9-1.2 micrometers. In some embodiments, the patterning forms the shallow reflector trench 1102s such that it is asymmetrical about a horizontal axis equally bisecting a trench height H of the shallow reflector trench 1102s. In some embodiments, the trench height H is about 500-2000 angstroms, about 500-1250 angstroms, or about 1250-2000 angstroms. In some embodiments, the patterning increases heights H' of the deep reflector trenches 1102d. The heights H' of the deep reflector trenches 1102d extend towards the substrate 106, beginning at the lower trench surface 1102ls, and may, for example, be about 500-1000 angstroms, about 500-750 angstroms, or about 750-1000 angstroms.

In some embodiments, a process for patterning the wire ESL 304a and the ILD structure 302 to form the shallow reflector trench 1102s comprises a photolithography/etching process. In some embodiments, the process comprises: 1) forming a mask 1106 over the wire ESL 304a and having a pattern of the shallow reflector trench 1102s; 2) performing an etch into the wire ESL 304a and the ILD structure 302 with the mask 1106 in place to form the shallow reflector trench 1102s; and 3) removing the mask 1106. The mask 1106 may be or comprise, for example, silicon nitride, silicon oxide, some other hard mask material, photoresist, or any combination of the foregoing.

Figure 11C:
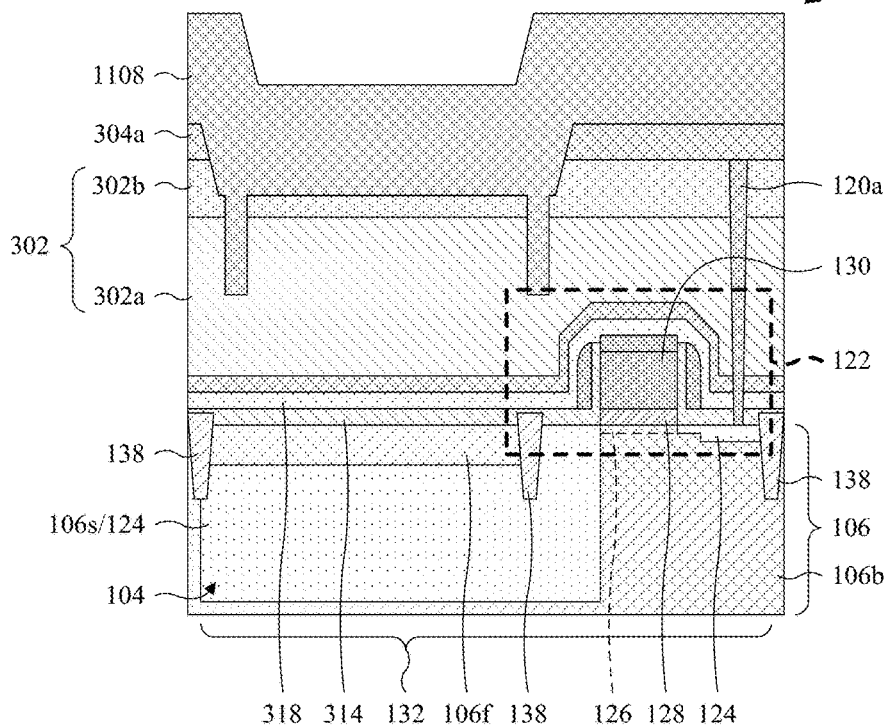

As illustrated by the cross-sectional view 1100C of FIG. 11C, a reflective layer 1108 is formed covering the wire ESL 304a and further filling the deep and shallow reflector trenches 1102d, 1102s (see FIG. 11B). The reflective layer 1108 is or comprises a reflective material. In some embodiments, the reflective material is conductive. In other embodiments, the reflector material is dielectric. The reflective material may be or comprise, for example, aluminum, aluminum copper, copper, some other reflective material, or any combination of the foregoing. In some embodiments, the reflective layer 1108 is formed by CVD, PVD, electroless plating, electroplating, some other deposition process, or any combination of the foregoing.

Figure 11D:
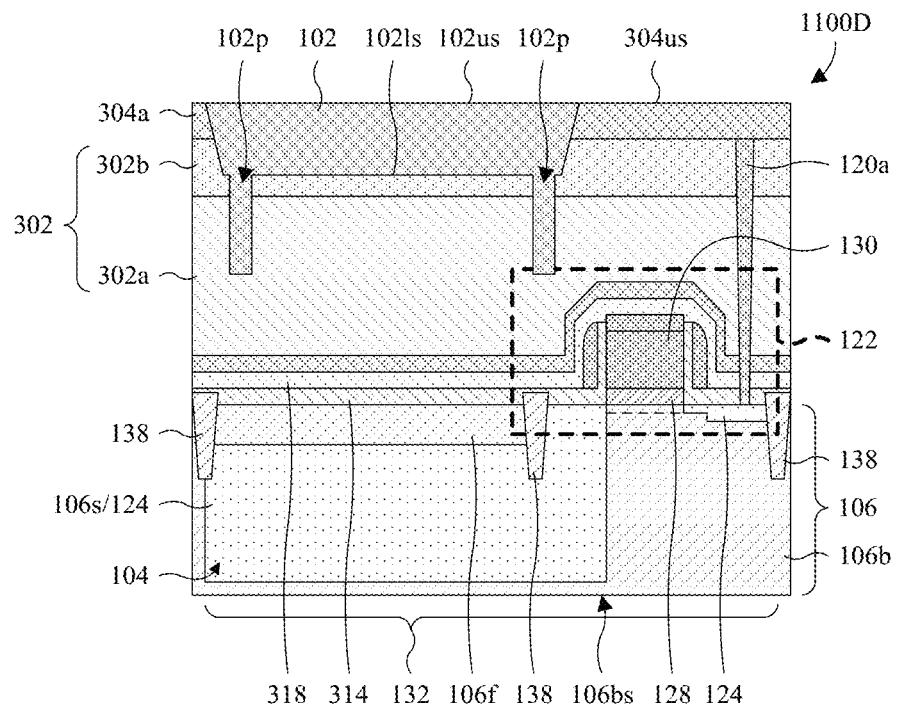

As illustrated by the cross-sectional view 1100D of FIG. 11D, a planarization is performed into the reflective layer 1108 (see FIG. 11C) to form a reflector 102 in the deep and shallow reflector trenches 1102d, 1102s (see FIG. 11B). Due to the deep reflector trenches 1102d, the reflector 102 has a pair of reflector protrusions 102p. The reflector protrusions 102p are respectively on opposite sides of the reflector 102 and protrude towards the substrate 106. Further, due to the planarization, an upper reflector surface 102us of the reflector 102 is flush with an upper ESL surface 304us. The planarization may, for example, be performed by a planarization.

During use of the photodetector 104, the photodetector 104 receives radiation (e.g., photons) from a backside 106bs of the substrate 106. A portion of the radiation is absorbed by the photodetector 104, whereas a remainder of the radiation passes through the photodetector 104. The reflector 102 reflects a portion of the radiation that passes through the photodetector 104 without being absorbed back to the photodetector 104. This gives the photodetector 104 a second chance to absorb the unabsorbed portion of the radiation and enhances the QE of the photodetector 104. Further, the reflector protrusions 102p keep a portion of the radiation that passes through the photodetector 104 without being absorbed localized to the photodetector 104. For example, the reflector protrusions 102p may receive unabsorbed radiation that would otherwise miss a lower reflector surface 102ls of the reflector 102 and may reflect the received radiation to the lower reflector surface 102ls for reflection back to the photodetector 104. As another example, the reflector protrusions 102p may receive radiation reflected off the lower reflector surface 102ls that would otherwise miss the photodetector 104 and may reflect the received radiation to the photodetector 104. Accordingly, due to the reflector protrusions 102p, cross talk between the photodetector 104 and a neighboring photodetector (not shown) is reduced. Further, QE of the photodetector 104 is further enhanced.

Figure 11E:
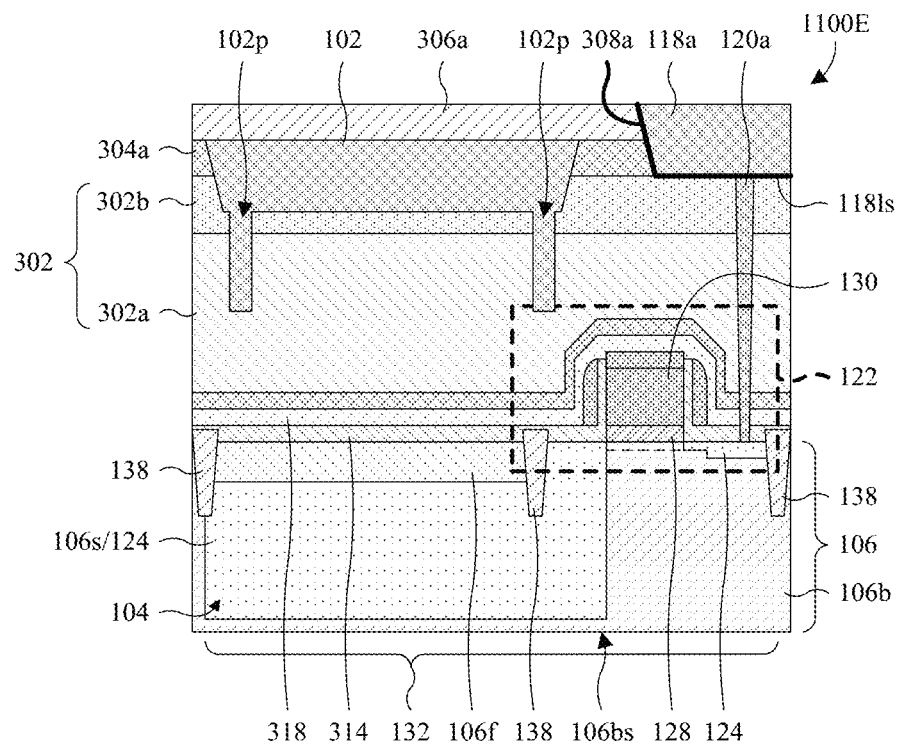

As illustrated by the cross-sectional view 1100E of FIG. 11E, an IWD layer 306a is formed covering the reflector 102 and the wire ESL 304a. The IWD layer 306a is dielectric and is a different material than the wire ESL 304a. The IWD layer 306a may be or comprise, for example, SiCOH, some other low κ dielectric, some other dielectric, or any combination of the foregoing. The IWD layer 306a may, for example, be formed by CVD, PVD, some other deposition process, or any combination of the foregoing.

Also illustrated by the cross-sectional view 1100E of FIG. 11E, a wire 118a is formed overlying and contacting the via 120. The wire 118a extends through the IWD layer 306a and the wire ESL 304a to the ILD structure 302, and a lower wire surface 118ls of the wire 118a is even or about even with a lower surface of the wire ESL 304a. In some embodiments, the wire 118a is elevated relative to the reflector 102. In some embodiments, an underside of the wire 118a is lined by a barrier layer 308a. The barrier layer 308a blocks material of the wire 118a from diffusing away from the wire 118a. The barrier layer 308a may be or comprise, for example, titanium nitride, tantalum nitride, or some other barrier material for the wire 118a. The wire 118a may be or comprise, for example, copper, aluminum copper, aluminum, some other metal or conductive material, or any combination of the foregoing. In some embodiments, the wire 118a is formed as described with regard to FIG. 10D.

While FIGS. 7-9, 10A-10D, and 11A-11E do not show formation of the BSI image sensor beyond formation of the wire 118a (see FIGS. 10D and 11E), it should be appreciated that the additional structure illustrated and described with regard to FIGS. 4A and 4B may be subsequently formed in some embodiments. For example, after the acts at FIG. 10D and/or FIG. 11E, the backside passivation layer 402, the color filter 404, the microlens 406, or any combination of the foregoing in FIGS. 4A and 4B may be formed on the backside 106bs of the substrate 106. Put another way, FIGS. 7-9 and 10A-10D illustrate first embodiments of a method for forming a BSI image sensor and, in some embodiments, the first embodiments form the additional structure at FIG. 4A after performing the acts at FIG. 10D. Similarly, FIGS. 7-9 and 11A-11E illustrate second embodiments of the method and, in some embodiments, the second embodiments form the additional structure at FIG. 4B after performing the acts at FIG. 11E. Further, while FIGS. 7-9 and 10A-10D illustrate the first embodiments of the method using the BSI image sensor of FIG. 3A, it is to be appreciated that the first embodiments of the method may also be used to form the BSI image sensor of FIG. 3B.

Figure 12:
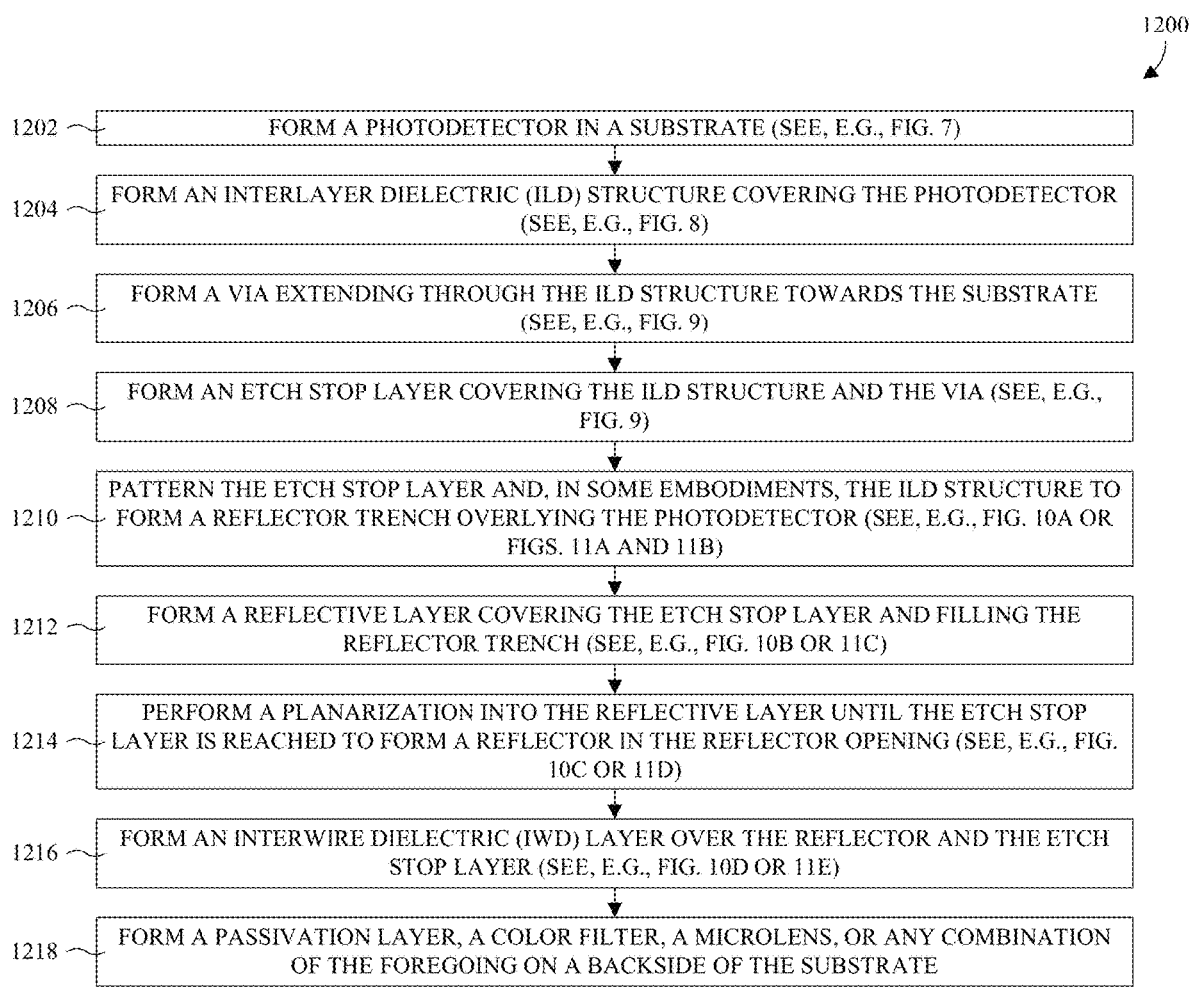
FIG. 12 illustrates a block diagram of some embodiments of the method of FIGS. 7-9, 10A-10D, and 11A-11E.

With reference to FIG. 12, a block diagram 1200 of some embodiments of a method for manufacturing a BSI image sensor with a reflector is provided. The method may, for example, be the method illustrated by FIGS. 7-9, 10A-10D, and 11A-11E.

At 1202, a photodetector is formed in a substrate. See, for example, FIG. 7.

At 1204, an ILD structure is formed covering the photodetector. See, for example, FIG. 8.

At 1206, a via is formed extending through the ILD structure towards the substrate. See, for example, FIG. 9.

At 1208, an etch stop layer is formed covering the ILD structure and the via. See, for example, FIG. 9.

At 1210, the etch stop layer and, in some embodiments, the ILD structure is/are patterned to form a reflector trench overlying the photodetector. See, for example, FIG. 10A or FIGS. 11A and 11B. In some embodiments, the patterning comprises a first etch to form a pair of deep reflector trenches in the etch stop layer and the ILD structure (see, e.g., FIG. 11A), and further comprises a second etch to form a shallow reflector trench (see, e.g., FIG. 11B). The deep reflector trenches are on opposite sides of the photodetector and are deep relative to the shallow reflector trench. The shallow reflector trench overlies the deep reflector trenches and extends from one of the deep reflector trenches to another one of the deep reflector trenches. Collectively, the deep and shallow reflector trenches define the reflector trench.

At 1212, a reflective layer is formed covering the etch stop layer and filling the reflector trench. See, for example, FIG. 10B or 11C.

At 1214, a planarization is performed into the reflective layer until the etch stop layer is reached to form a reflector in the reflector opening. See, for example, FIG. 10C or 11D. The reflector is configured to reflect radiation that passes through the photodetector without being absorbed back to the photodetector. This gives the photodetector a second chance to absorb the radiation and enhances the QE of the photodetector. The enhanced QE may, for example, enable use of the photodetector with high wavelength radiation. High wavelength radiation may, for example, include radiation with wavelengths greater than about 900 nanometers, and/or may, for example, include NIR radiation with a wavelength of about 940 nanometers.

At 1216, an IWD layer is formed over the reflector and the etch stop layer. See, for example, FIG. 10D or 11E.

At 1218, a passivation layer, a color filter, a microlens, or any combination of the foregoing is/are formed on a backside of the substrate, where the backside of the substrate is on an opposite side of the substrate as the reflector. Examples of the passivation layer, the color filter, and the microlens may, for example, be seen through reference respectively to the backside passivation layer 402 of FIGS. 4A and 4B, the color filter 404 of FIGS. 4A and 4B, and the microlens 406 of FIGS. 4A and 4B.

While the block diagram 1200 of FIG. 12 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, the present application provides an IC chip including: a substrate including a photodetector; an ILD structure over the substrate; an etch stop layer over the ILD structure; a wire in the etch stop layer; and a reflector directly over the photodetector and in the etch stop layer. In some embodiments, the reflector has a lower reflector surface facing the photodetector, wherein the lower reflector surface is substantially flat from a first reflector sidewall of the reflector to a second reflector sidewall of the reflector, and wherein the first and second reflector sidewalls are respectively on opposite sides of the reflector. In some embodiments, the first and second reflector sidewalls each contact the lower reflector surface at an obtuse angle, and wherein the obtuse angle is between about 95-115 degrees. In some embodiments, an upper wire surface of the wire is elevated above an upper reflector surface of the reflector. In some embodiments, the reflector has a lower reflector surface facing the photodetector and further has a pair of reflector protrusions, wherein reflector protrusions extend towards the substrate from the lower reflector surface and are respectively on opposite sides of the reflector. In some embodiments, the reflector protrusions each have a rectangular cross section. In some embodiments, a cross section of the reflector is a convex isosceles trapezoid. In some embodiments, the reflector is conductive and electrically floating. In some embodiments, the IC chip further includes a color filter or a microlens directly under the photodetector and on a backside of the substrate, wherein the reflector is on a frontside of the substrate that is opposite the backside.

In some embodiments, the present application further provides a method for forming an image sensor, the method including: forming a photodetector in a substrate; forming a gate electrode over the substrate; forming a dielectric structure over the substrate and the gate electrode; patterning the dielectric structure to form a reflector trench directly over the photodetector; depositing a reflective layer overlying the dielectric structure and further filling the reflector trench; and performing a planarization into the reflective layer until the dielectric structure is reached to form a reflector. In some embodiments, the forming of the dielectric structure includes: forming an ILD structure over the substrate; and forming an etch stop layer over the ILD structure, wherein the patterning patterns the etch stop layer to form the reflector trench in the etch stop layer. In some embodiments, the method further includes forming a via extending from an upper surface of the ILD structure to the substrate, wherein the etch stop layer is formed covering the via. In some embodiments, the patterning includes: performing a first etch into an upper surface of the dielectric structure to form a pair of first trenches, wherein the first trenches have a first depth and are respectively on opposite sides of the photodetector; and performing a second etch into the upper surface of the dielectric structure to form a second trench, wherein the second trench has a second depth less than the first depth and extends laterally from one of the first trenches to another one of the first trenches, and wherein the first and second trenches collectively define the reflector trench. In some embodiments, the patterning forms a pair of reflector sidewalls in the reflector opening, wherein the reflector sidewalls are defined by the dielectric structure and are respectively on opposite sides of the reflector trench, wherein the reflector sidewalls contact a top surface of the dielectric structure, and wherein the reflector opening has a substantially uniform depth from one of the reflector sidewalls to another one of the reflector sidewalls. In some embodiments, the method further includes: forming an IWD layer over the reflector and the dielectric structure; patterning the IWD layer and the dielectric structure to form a wire opening, wherein the dielectric structure defines a lower opening surface in the wire opening, and wherein an upper reflector surface of the reflector is elevated relative to the lower opening surface; and forming a wire filling the wire opening. In some embodiments, the method further includes forming a color filter or a microlens on a backside of the substrate, wherein the reflector is formed on a frontside of the substrate opposite the backside.

In some embodiments, the present application provides an image sensor including: a substrate including a photodetector; a gate electrode over the substrate and neighboring the photodetector; a dielectric structure over the substrate and the gate electrode; a wire in the dielectric structure; a via in the dielectric structure and extending from the wire to the substrate; and a reflector directly over the photodetector and in the dielectric structure, wherein a lower reflector surface of the reflector is elevated above an upper electrode surface of the gate electrode, and wherein an upper wire surface of the wire is elevated above an upper reflector surface of the reflector. In some embodiments, the dielectric structure includes an ILD structure and an etch stop layer, and wherein the etch stop layer overlies the ILD structure and has an upper surface flush with the upper reflector surface. In some embodiments, the reflector has a pair of reflector sidewalls, wherein the reflector sidewalls are respectively on opposite sides of the reflector and adjoin the upper reflector surface, and wherein a height of the reflector is substantially uniform from one of the reflector sidewalls to another one of the reflector sidewalls. In some embodiments, the reflector has a pair of reflector protrusions, wherein the reflector protrusions are respectively on opposite sides of the reflector and protrude towards the substrate from the lower reflector surface.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) chip, comprising:
a substrate comprising a photodetector;
an interlayer dielectric (ILD) structure over the substrate;
an etch stop layer over the ILD structure;
a wire in the etch stop layer; and
a reflector directly over the photodetector and in the etch stop layer.

2. The IC chip according to claim 1, wherein the reflector has a lower reflector surface facing the photodetector, wherein the lower reflector surface is substantially flat from a first reflector sidewall of the reflector to a second reflector sidewall of the reflector, and wherein the first and second reflector sidewalls are respectively on opposite sides of the reflector.

3. The IC chip according to claim 2, wherein the first and second reflector sidewalls each contact the lower reflector surface at an obtuse angle, and wherein the obtuse angle is between about 95-115 degrees.

4. The IC chip according to claim 1, wherein an upper wire surface of the wire is elevated above an upper reflector surface of the reflector.

5. The IC chip according to claim 1, wherein the reflector has a lower reflector surface facing the photodetector and further has a pair of reflector protrusions, and wherein reflector protrusions extend towards the substrate from the lower reflector surface and are respectively on opposite sides of the reflector.

6. The IC chip according to claim 5, wherein the reflector protrusions each have a rectangular cross section.

7. The IC chip according to claim 1, wherein a cross section of the reflector is a convex isosceles trapezoid.

8. The IC chip according to claim 1, wherein the reflector is conductive and electrically floating.

9. The IC chip according to claim 1, further comprising:
a color filter or a microlens directly under the photodetector and on a backside of the substrate, wherein the reflector is on a frontside of the substrate that is opposite the backside.

10. An image sensor, comprising:
a substrate comprising a photodetector;
a gate electrode over the substrate and neighboring the photodetector;
a dielectric structure over the substrate and the gate electrode;
a wire in the dielectric structure;
a via in the dielectric structure and extending from the wire to the substrate; and
a reflector directly over the photodetector and in the dielectric structure, wherein a lower reflector surface of the reflector is elevated above an upper electrode surface of the gate electrode, wherein an upper reflector surface of the reflector is elevated above a lower wire surface of the wire, and wherein an upper wire surface of the wire is elevated above the upper reflector surface of the reflector.

11. The image sensor according to claim 10, wherein the dielectric structure comprises an interlayer dielectric (ILD) structure and an etch stop layer, and wherein the etch stop layer overlies the ILD structure and has an upper surface flush with the upper reflector surface.

12. The image sensor according to claim 10, wherein the reflector has a pair of reflector sidewalls, wherein the reflector sidewalls are respectively on opposite sides of the reflector and adjoin the upper reflector surface, and wherein a height of the reflector is substantially uniform from one of the reflector sidewalls to another one of the reflector sidewalls.

13. The image sensor according to claim 10, wherein the reflector has a pair of reflector protrusions, wherein the reflector protrusions are respectively on opposite sides of the reflector and protrude towards the substrate from the lower reflector surface.

14. An image sensor comprising:
a substrate comprising a photodetector;
a wire over the substrate, wherein the wire has a frontside wire surface facing away from the substrate and further has a backside wire surface facing the substrate;
a contact via extending from the wire to the substrate; and
a reflector overlying the photodetector, wherein the reflector has a frontside reflector surface that faces away from the substrate, and wherein the frontside reflector surface is closer to the substrate than the frontside wire surface and is farther from the substrate than the backside wire surface.

15. The image sensor according to claim 14, wherein the reflector has a pair of protrusions that are respectively on opposite sides of the reflector and that protrude towards the substrate.

16. The image sensor according to claim 15, wherein the protrusions have individual top layouts that are line shaped and that are spaced from each other.

17. The image sensor according to claim 15, wherein the reflector has first sidewalls that are substantially vertical at the protrusions, and wherein the reflector further has second sidewalls that are over the first sidewalls and that are angled relative to the first sidewalls.

18. The image sensor according to claim 15, wherein the protrusions have a rectilinear cross-sectional profile.

19. The image sensor according to claim 14, wherein the reflector has a backside reflector surface facing the substrate, wherein the backside wire surface is spaced from the substrate, and wherein the backside reflector surface is closer to the substrate than the backside wire surface.

20. The image sensor according to claim 14, further comprising:
an etch stop layer over the substrate; and
an intermetal dielectric (IMD) layer over and directly contacting the etch stop layer at an inter-layer interface, wherein the inter-layer interface is level with the frontside reflector surface.

* * * * *